United States Patent [19]

Raymond, Jr.

[11] 4,037,090

[45] July 19, 1977

[54] MULTIPHASE CLOCKING FOR MOS

[75] Inventor: Joseph H. Raymond, Jr., Houston, Tex.

[73] Assignee: Texas Instruments Incorporated, Dallas, Tex.

[21] Appl. No.: 713,062

[22] Filed: Aug. 9, 1976

Related U.S. Application Data

[63] Continuation of Ser. No. 525,246, Nov. 19, 1974, abandoned.

[51] Int. Cl.² .............................................. G06F 1/04
[52] U.S. Cl. ..................................... 235/152; 364/200
[58] Field of Search ............................... 235/152, 156; 340/172.5

[56] References Cited

U.S. PATENT DOCUMENTS 3,800,129  3/1974  Umstattd ............................ 235/156
3,863,060  1/1975  Rode et al. .......................... 235/156
3,878,514  4/1975  Faber .................................. 340/172.5

Primary Examiner—David H. Malzahn
Attorney, Agent, or Firm—John G. Graham

[57] ABSTRACT

An MOS/LSI semiconductor chip for providing the functions of an electronic calculator or digital processor includes a RAM for data storage, a ROM for program instruction storage, an arithmetic unit for performing operations on data, and control circuitry for defining the functions of the machine in response to instructions from the ROM as well as conditions in the machine and inputs from external. The operation is digit oriented in that in a basic machine cycle one digit of the RAM is accessed. Also, in a machine cycle the ROM is addressed to provide an instruction word, and the word is decoded and executed. A unique five phase clocking arrangement is used which permits the complex operations to be implemented within a machine cycle.

22 Claims, 28 Drawing Figures

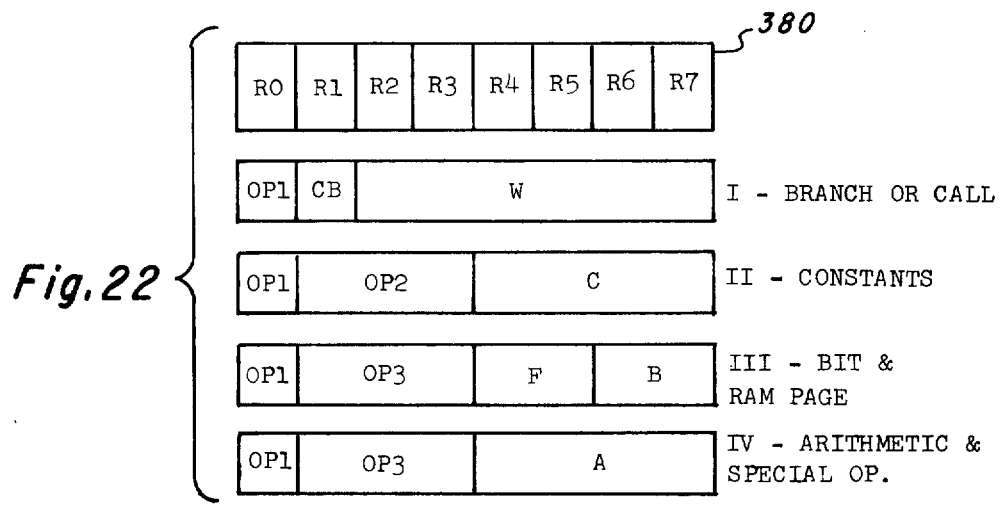

MULTIPHASE CLOCKING FOR MOS

This is a continuation of application Ser. No. 525,246, filed Nov. 19, 1974, now abandoned.

RELATED CASES

This application discloses subject matter related to that disclosed and claimed in the following U.S. Pat. applications, all filed herewith and assigned to Texas Instruments Incorporated, the assignee of this invention: Ser. Nos. 525,236, now U.S. Pat. No. 3,991,305; 525,249, now U.S. Pat. No. 3,491,306; 525,250, now U.S. Pat. No. 3,988,604; 525,237, now U.S. Pat. No. 3,989,939; 525,238, and 525,247.

BACKGROUND OF THE INVENTION

The invention relates to calculator or digital data processing systems, and particularly to an improved MOS/LSI semiconductor chip for use in such systems.

Electronic calculator systems of the type having all of the main electronic functions within a single large scale integrated (LSI) semiconductor chip, or a small number of chips, are described in the following prior applications or patents assigned to Texas Instruments Incorporated: U.S. Pat. No. 3,819,921, by Kilby et al, for "Miniature Electronic Calculator", based on an application originally filed Sept. 29, 1967; Ser. No. 163,565, filed July 19, 1971 by Boone and Cochran, for "Variable Function Programmed Calculator" (now Ser. No. 420,999, filed Dec. 3, 1973); Ser. No. 400,473, filed Sept. 24, 1973, by Bryant for "Digit Mask Logic In Electronic Calculator Chip" now U.S. Pat. 3,892,957 issued July 1, 1975; Ser. No. 400,437, filed Sept. 24, 1973, by Vandierendonck, Fisher and Hartsell for "Electronic Calculator With Display And Keyboard Scanning" now U.S. Pat. No. 3,987,416; Ser. No. 397,060, filed Sept. 13, 1973 by Cochran and Grant, for "Multi-Chip Calculator System" now U.S. Pat. No. 3,900,722 issued Aug. 19, 1975; and others.

These prior inventions have made possible vast reductions in cost and size, and increases in functions, in electronic calculators. Many millions of such calculators have been produced. The efforts to reduce manufacturing costs and increase the functions available to the user are continuing. Particularly, it is desirable to provide a basic chip structure that is quite versatile and can be used for many different types of calculators and similar digital processing equipment. This permits a single manufacturing facility to produce large quantities of the same devices, differing only in a single mask change, to produce dozens of different variations, while still maintaining large volume cost advantages.

The previous MOS/LSI calculator chips as referred to above were generally register organized in that a single instruction word operated on all of the digits in a given register. A more versatile approach is to make the machine "digit organized," operating on one digit at a time. For example, it may be desired to test or set a particular one bit flag. In a register machine an entire thirteen digit register must be addressed and masked to implement this, whereas a digit organized machine may access only the needed digit or bit. An example of a calculator chip of such nature is referred to at pages 31-32 of "Electronics," Sept. 25, 1972, by Rockwell.

SUMMARY OF THE INVENTION

An MOS/LSI semiconductor chip for providing the functions of an electronic calculator or digital processor includes a RAM for data storage, a ROM for program instruction storage, an arithmetic unit for performing operations on data, and control circuitry for defining the functions of the machine in response to instructions from the ROM as well as conditions in the machine and inputs from external. The operation is digit oriented in that in a basic machine cycle one digit of the RAM is accessed. Also, in a machine cycle the ROM is addressed to provide an instruction word, and the word is decoded and executed. The invention is directed to a unique five phase clocking arrangement which permits all of the complex operations to be implemented within a machine cycle. The machine cycle includes six intervals. A first clock voltage occupies two intervals, and is used to access the RAM. A second clock voltage occupies two intervals spaced from that of the first clock, and is used to access the ROM. A third clock voltage occupies three intervals which partly overlap both first and second clock voltages, and is used for precharging a number of devices. A fourth clock voltage has two pulses per machine cycle and these occupy the initial intervals in each of the first and second clock voltages; this is used for precharging the common ROM/RAM decoder which is used twice each machine cycle. A fifth clock voltage occupies the interval between the first and second clock voltages, and is used in self-refreshing circuitry for the RAM. These clock voltages are of course used in many other points in the system.

This arrangement saves power in the system because many precharge/discharge or dynamic devices may be used, and also provides facility for operations to occur at various points in the system in close time proximity.

BRIEF DESCRIPTION OF THE DRAWINGS

The novel features believed characteristics of the invention are set forth in the appended claims. The invention itself, however, as well as other features and advantages thereof, will be best understood by reference to the detailed description which follows, read in conjunction with the accompanying drawings, wherein:

FIG. 22 is a representation of the instruction word used in the system of the invention;

FIG. 23 is a Karnaugh map of instruction words typically used in the system of the invention;

DETAILED DESCRIPTION OF SPECIFIC EMBODIMENT

The Overall System

Figure 1:
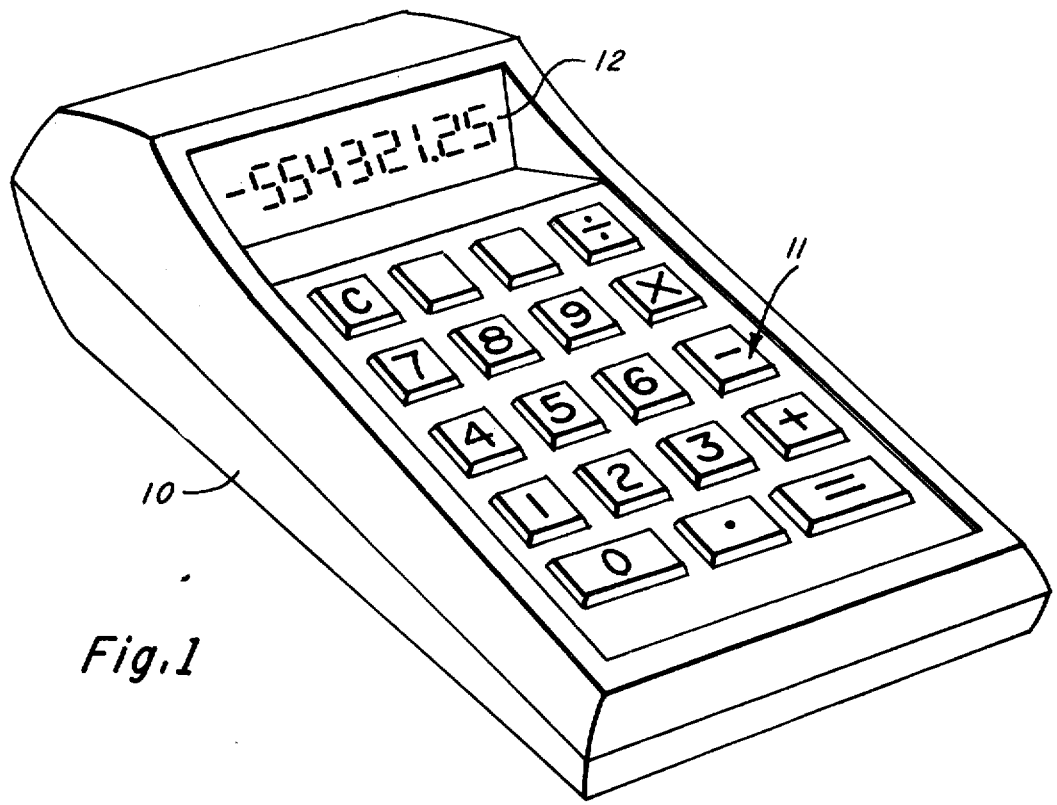
FIG. 1 is a pictorial view of a small hand-held calculator in which the system of the invention may be utilized.

Referring to FIG. 1, a small electronic calculator in which the digital processor of the invention can be used is shown, comprising a housing 10 of molded plastic or the like, with a keyboard 11 and a display 12. The keyboard includes number keys 0-9, a decimal point key, and several standard operation keys such as +, −, =, ×, ÷, C (clear), etc. In a preferred embodiment, the calculator system is designed to perform scientific functions, so keys such as EE (enter exponent), $\sqrt{x}$, $X^2$, $\sqrt[x]{y}$, $Y^x$, SIN, COS, TAN, LOG, etc., may be included in the keyboard 11. Many other functions may be included, depending upon the programming. The display 12 can be, for example, from six to twelve digits of the seven segment type, with provision for decimal point and perhaps commas, as well as two digits on the right hand side for exponents or scientific notation. The display may comprise light emitting diodes (LED's) or a gas dicharge panel, or liquid crystal devices, for example. The calculator is a self-contained unit having a power supply in the form of a battery or batteries within the housing 10, although an AC adapter may be attached, as well as a battery charger.

Figure 2:
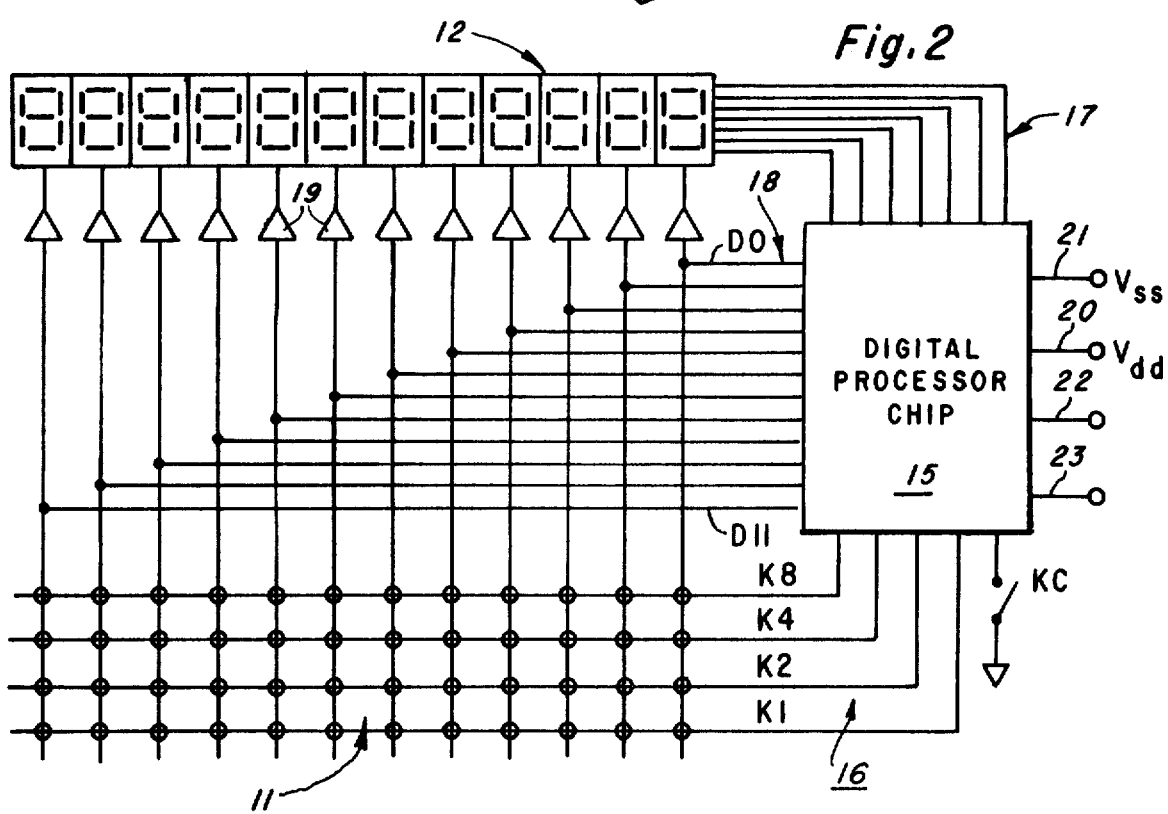
FIG. 2 is a block diagram of the system of the calculator of FIG. 1.

Essentially all of the electronic circuits of the calculator system are contained within a large-scale-integrated semiconductor chip which is typically packaged in a twenty-eight pin plastic package and mounted on a printed circuit board within the housing 10. The general organization of the calculator system is seen in block diagram in FIG. 2, where the keyboard 11 and display 12 are shown connected to the semiconductor chip 15. Inputs to the chip are by four "K lines" 16 which are designated K1, K2, K4, K8, and a clear key input KC. Outputs from the chip include eight segment outputs 17 which are connected to common segments of the display 12. All like segments in each of the digits of the display are connected together, so only eight segment outputs are needed. The digits of the display 12 are driven by output lines 18 which are labelled D0 to D11, with digit drivers 19 being used to provide suitable voltage and current levels for the particular display. Depending upon the number of digits in the display, the number of output lines 18 could be any number up to thirteen. As will be seen, the number of digits in the display 12, the number of K lines 16 needed for the keyboard, and whether or not hardware clear key KC is used, as well as the desired number of pins for the package, are optimized for a specific design. The lines 18 are also connected to the matrix of key switches which make up the keyboard 11. Assuming there are thirteen output lines 18, the matrix contains a maximum of thirteen times four or 52 crosspoints so there are 52 possible key positions (plus KC), not all of which are used for a given design. A minimum function calculator with only a [X], [÷], [+], [−], [=], [C], [.], [0−9] keyboard would need only seventeen keys. Other input/output pins for the chip 15 include a clear key input KC which can be used for the "C" or clear function, a single voltage supply or Vdd line 20, a ground or Vss pin 21, and two oscillator input and output pins 22 and 23 which control the various options for the on-chip oscillator. Usually the pins 22 and 23 are connected together and a resistor connected to Vdd from the pins for setting the frequency of an internal clock generator. More accuracy is provided by having a capacitor connected to ground. To have one of the chips 15 synched by another, the pins 22 and 23 are not connected, but the external synch from the output pin 23 of the other chip is connected to the input pin 22 of the driven chip. A typical clock frequency in 500 KHz.

A standard 28 pin integrated circuit package may thus be employed for an eleven digit display. It is apparent that the 44 key switches, eleven digit and eight segments per digit would require an excessive number of pins if all input/output connections were made directly, so time-multiplexing of the keyboard and display input-/output in the manner set forth in application Ser. No. 163,565 is vital. Twenty-four lines in the groups 16, 17 and 18 provide the equivalent of 44 + 11 × 8 or 132 connections.

The chip 15 can provide a variety of functions as a general purpose digital processor. When used as a calculator as in FIGS. 1 and 2, the unit accepts keyboard inputs on the lines 16, performs functions such as add, subtract, multiply, divide, square root, etc. on the input data as selected by operation keys, and outputs the results to the display 12. The electronic system needed to perform these functions is implemented in an MOS/LSI semiconductor chip containing over 8,800 MOS transistors on a wafer of silicon less than 0.2 × 0.2 inch in size. The chip can be manufactured in volume for a unit cost of a few dollars, making possible a calculator having very sophisticated functions yet selling in the twenty or thirty dollar range.

THE SYSTEM BLOCK DIAGRAM

Figure 3:
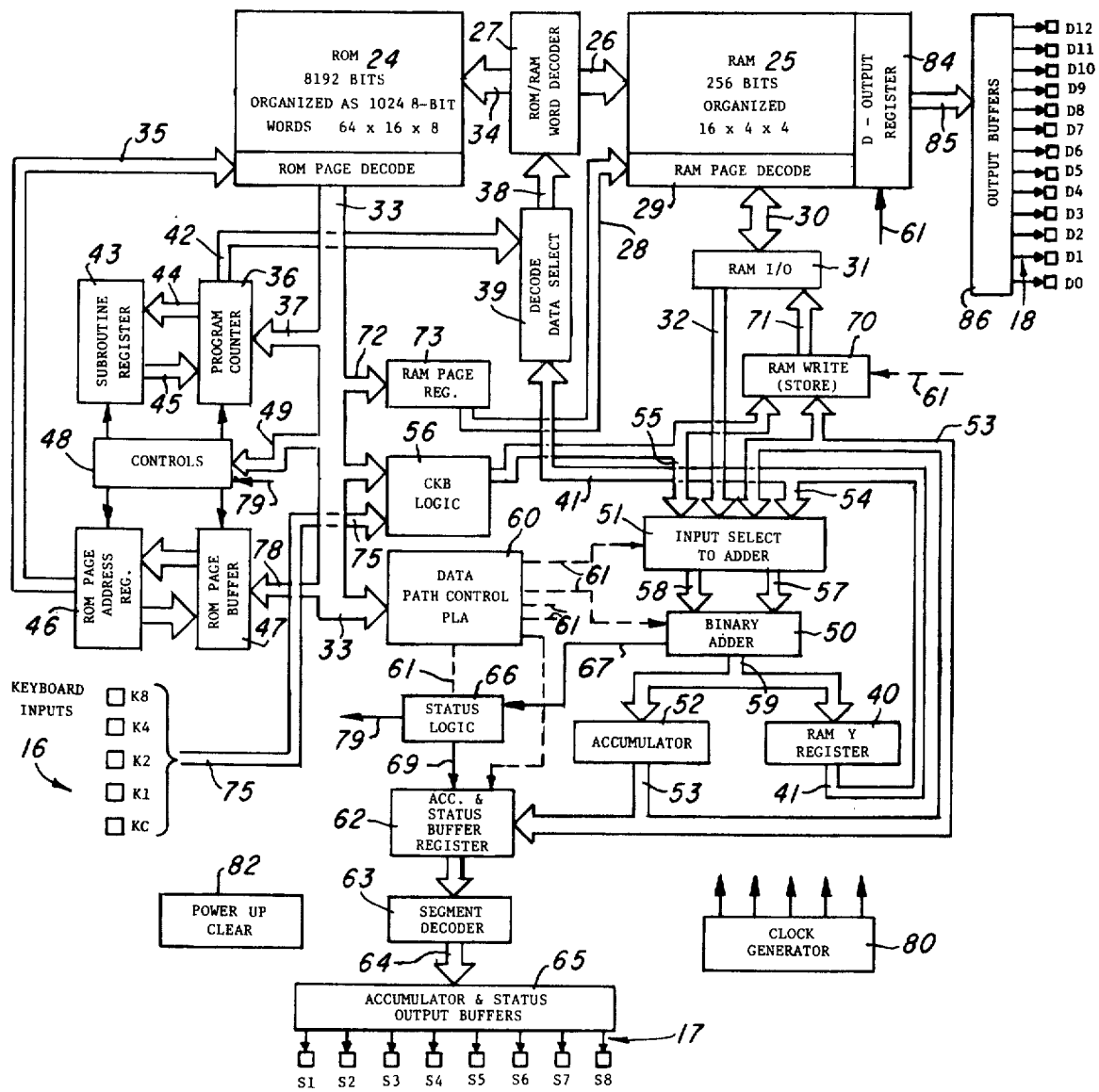
FIG. 3 is a detailed block diagram of an electronic system using the invention, in particular the digital processor chip 15 of FIG. 2.

A block diagram of the system implemented on the chip 15 is shown in FIG. 3. The system is centered around a ROm (read-only-memory) 24 and a RAM (random-access-memory)25. The ROM 24 contains 1024 instruction words of 8 bits per word, and is used to store the program which operates the system. The RAM 25 contains 256 memory cells software organized as four sixteen-digit groups with 4 bits per digit. Numerical data entered by the keyboard is stored in the RAM 25, along with intermediate and final results of calculations, as well as status information or "flags", decimal point position and other working data. The RAM functions as the working registers of the calculator system, although it is not organized in a hardware sense as separate registers as would be true if shift registers or the like were used for this purpose. The RAM is addressed by a word address on lines 26, i.e., one out of sixteen word lines in the RAM is selected, by means of a combined ROM and RAM word address decode circuit 27. One of four "pages" of the RAM is selected by an address signal on two lines 28 applied to a RAM page address decoder 29 in the RAM. For a given word address on lines 26 and page address on lines 28, four specific bits are accessed and read out on RAM I/O lines 30, via input/output circuit 31, to RAM read lines 32. Alternatively, data is written into the RAM 25 via the input/output circuitry 31 and the lines 30. The same sixteen lines 27 used as RAM word address are also used to generate the display and keyboard scan on the lines 18; to this end the lines 26 pass through the RAM 25 and are connected to output registers and buffers as will be explained.

The ROM 24 produces an eight bit instruction word on ROM output lines 33 (the bits of the instruction word being labeled RO-R7) during each instruction cycle. The instruction is selected from 8192 bit locations in the ROM, organized into 1024 words containing 8 bits each. The words are divided into 16 groups or pages of 64 words each. To address an instruction in the ROM requires a 1of 64 ROM word address on lines 34 and a 1of 16 ROM page address on lines 35. The ROM word address on lines 34 is generated in the same decoder 27 as used to generate the ROM word address on lines 26. The ROM word address is a 6 bit address produced in a program counter 36 which is a six-state shift register that may be updated after an instruction cycle or may have a 6 bit address loaded into it via lines 37 from ROM output lines 33 for a call or branch operation. The RAM and ROM word address decoder 27 receives a six-bit encoded address on lines 38 from decode data select unit 39 which has two inputs. The unit 39 receives a 4 bit address from RAM Y register 40 via lines 41, receives a six-bit address from the program counter 36 via lines 42, during each instruction cycle. A 6-bit subroutine register 43 is associated with the program counter 36 to serve as temporary storage for the return word address during subroutine operations. A 6-bit address is stored in the register 43, via lines 44 when a call instruction is initiated so that this same address may be loaded back into the program counter 36 via lines 45 when execution of the subroutine which begins at the call location has been completed; this conserves instruction words and makes programming more flexible. The ROM page address on lines 35 is generated in a page address register 46 which also has a buffer register 47 associated with it for subroutine purposes. The register 46 will always contain the current page address for the ROM, and directly accesses the ROM page decoder. The buffer register 47 is a multifunction buffer and temporary storage register, the contents of which can be the present ROM page address, an alternate ROM page address, or the return page address during subroutine operations. The program counter, subroutine register and ROm page addressing are all controlled by control circuitry 48 which receives inputs from the ROM output lines 33 via lines 49. The control circuitry 48 determines whether branch and call on "status" or subroutine operations are performed, causes loading of an instruction word into the program counter and/or page address register, controls transfer of bits to the subroutine or buffer registers and back, controls updating of the program counter, etc.

Numerical data and other information is operated upon in the system by a binary adder 50 which is a bit-parallel adder having a precharged carry circuit, operating in binary with software BCD correction. The input to the adder 50 is determined by an input selector 51 which receives four-bit parallel inputs from several sources and selects from these what inputs are applied to the adder. First, the memory read or recall lines 32 from the RAM 25 provide one of the alternatives. Two registers receive the adder output, these being the "RAM Y" register 40 and an accumulator 52, and each of these has output lines separately connected as inputs 53 and 54 of the selector 51. A fourth input 55 receives an output from "CKB" logic as will be explained. Thus, the adder input is selected from the following sources: data memory or RAM 25 on lines 32; accumulator 52 via lines 53; RAM Y register 40 via lines 54; constant, keyboard or "bit" information from CKB logic 56 on lines 55. Positive and negative inputs to the adder 50 on lines 57 and 58 are produced from the selector circuitry 51.

The output from the adder 50 is applied to either or both the RAM Y register 40 and the accumulator 52 via lines 59. All of the operations of the adder 50 and its input selector 51, etc., are controlled by a data path control PLA 60 which is responsive to the instruction word on lines 33 from the ROM. Control outputs 61 from the control PLA 60 are indicated by dotted lines. The four-bit output from the accumulator can be applied via lines 53 to an accumulator output buffer 62 and thus to a segment decoder 63 for output from the system. The segment decoder 63 is a programmable logic array like that disclosed in application Serial No. 163,565, and produces up to eight segment outputs on lines 64 which are applied to a set of eight output buffers 65. The output arrangement contains memory in the buffer 62 so that an output digit can be held for more than one machine cycle. Output is under control of the data control logic PLA 60 which is responsive to the instruction word on lines 33 from the ROM.

A status logic circuit 66 provides the function of examining for carry or compare from the adder 50, and determining whether to branch or call. To this end, inputs from the adder 50 via lines 67, and input from the control PLA 60 via lines 61 are provided. That status logic 66 includes a latch which produces an output 69 to the output buffer register 62; this can be decoded out via segment decode 62 in many different ways. It can be used to indicate decimal point DPT, and used to select two digit code sequences such as seven-segment or BCD out of the same PLA. For DPT, a BCD code of the desired DPT place would be stored in a location in RAM 25, and this would be compared in adder 50 with the current D line 18 being actuated which is defined in RAM Y register 40, and if they are the same, status latch is set and DPT is shown on the display for that digit. Further, the status latch can be used to delineate between BCD data out on certain lines 17, and control outputs on other lines 17.

A control circuit 70 determines what and when data is written into or stored in the RAM 25 via input/output control 31 and lines 30. This RAM write control 70 receives inputs from either the accumulator 52 via lines 53 or the CKB logic 56 via lines 55, and this circuit produces an output on lines 71 which go to the RAM I/O circuit 31. Selection of what is written into the RAM is made by the instruction word on lines 33, via the data path control PLA 60 and command lines 61. An important feature of the system is that constants or keyboard information, from CKB logic 56, as well as the adder output via the accumulator, may be written into the RAM, via the write control 70, and further the CKB logic 56 can be used to control the setting and resetting of bits in the RAM, via the write control 70.

The RAM page address into which data is written is determined by two bits of the instruction word on lines 33, as applied via lines 72 to a RAM page address register 73 and thus to lines 28 which select the RAM page. The RAM word or Y address is of course selected by the contents of RAM Y register 40, select circuit 39 and decoder 27.

The four keyboard inputs 16 appear on lines 75, from which an input to the CKB logic 56 is provided. In normal operation, a keyboard input goes via CKB logic 56 to the accumulator 52 or RAM Y register 40, from whence it is examined by software or ROM programming. In manufacture of the chips, a test mode is possible, where the keyboard input on lines 75 can be entered directly into the ROM page buffer address register 46, as will be explained. Also, during hardware clear using the KC input, the K lines can be entered into the page address register, or a K line can be used as an interrupt, in non-calculator applications.

Also included within the chip 15 is a clock oscillator and generator 80 which generates internally a basic clock frequency of about 500 KHz or less, and from this produces five clocks $\phi 1$ to $\phi 5$ used throughout the system. A power-up-clear circuit 82 produces controls which clear the calculator when the power is turned on. This may be also supplemented by the KC input with an external capacitor.

The outputs 18 from the chip 15, used for keyboard and display scanning, are generated from the RAM word address on lines 26 by an output register 84 which is loaded under control of lines 61 as addressed by RAM word lines 26. The output from the register 84 is connected via lines 85 to a set of output buffers 86. Sixteen outputs are possible, but only perhaps nine to thirteen would be provided as outputs in a typical calculator design; for example eight digits for mantissa, two for exponents, and two for annotators such as minus sign for mantissa and exponent.

It is important that the register 84 is a random access register, where all bits are separately, independently, and mutually exclusively addressed. In this embodiment, only thirteen stages are provided in the register 84, so only the first thirteen of the sixteen address lines 26 are used. When one of the 13 bits in the register 84 is addressed from decoder 27, this bit may be either set or reset as determined by controls 61 from the control PLA, i.e., from the current instruction word. The bit will remain set or reset until again specifically addressed and changed; meanwhile any or all of the other bits may be addressed and and set or reset in any order. Thus, it is possible to have any combination of D register bits either set or reset, providing $2^{13}$ or 8192 code combinations on the output lines 18. During power up or hardware clear, all the bits of the register 84 are unconditionally reset.

Similar to the register 84, the other output register 62 is static in that the contents once entered will remain until intentionally altered. The output register 62 functions as an output data buffer while the accumulator 52 and status latch 66 are being manipulated to form the next output. The output register 84 is a similar buffer for outputting the contents of the Y register 40, but has the additional feature of being fully random access. The data sources for the Y register 40 are the following: a 4-bit constant stored in the ROM 24 as part of an instruction word; the accumulator 52 transferred to the Y register 40 via the selector 51 and adder 50; and data directly from the RAM 25. Once data is in the Y register 40 it can be manipulated by additional instructions such as increment or decrement.

SYSTEM TIMING

Figure 4:
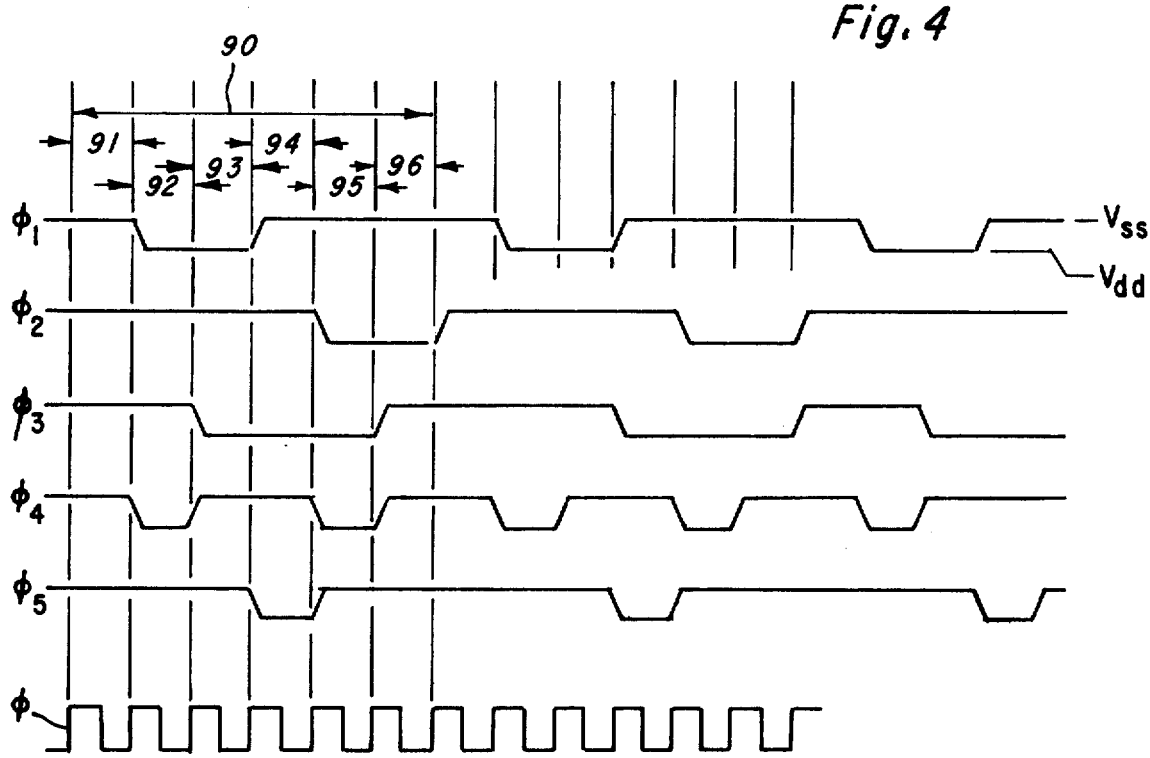
FIG. 4 is a timing diagram in the form of a graph of voltage vs. time for clock voltages used in the system of FIG. 3.

A timing diagram for clock voltage waveforms used in the chip 15 of FIG. 3 is shown in FIG. 4. The basic machine cycle, also referred to as an instruction cycle, is an interval 90 made up of six intervals labeled 91-96, each of which is nominally two or more microseconds in length, so the machine cycle 90 is 12 microseconds or more. The phase $\phi 1$ exists during intervals 92 and 93, $\phi 2$ during 95 and 96, $\phi 3$ during 93, 94 and 95, and $\phi 5$ during interval 94, as seen in the drawing. The basic clock $\phi$ from which the clocks $\phi 1$-$\phi 5$ are derived in the clock oscillator generator 80 is shown for reference.

THE DATA MEMORY

Figure 5:
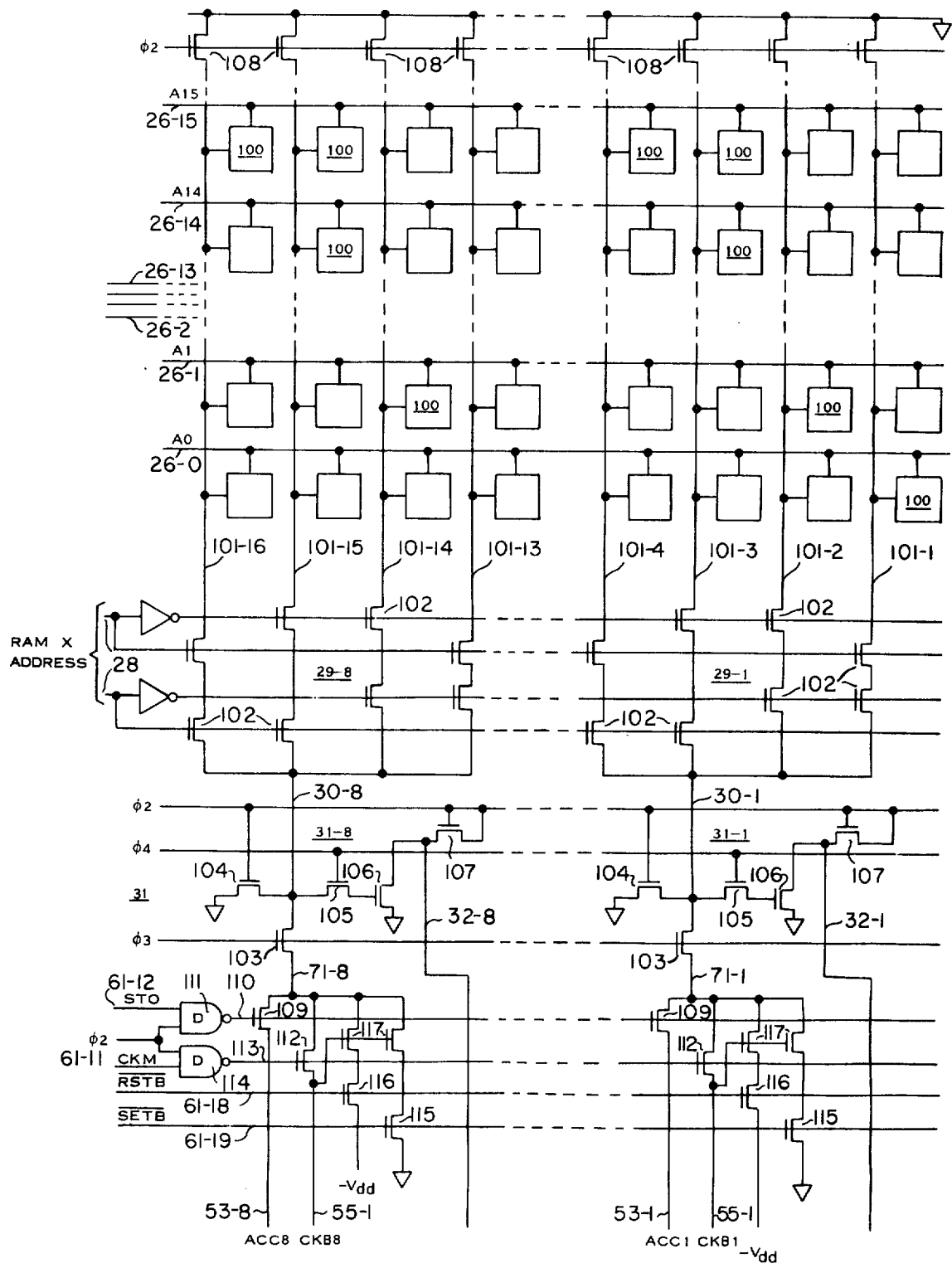
FIG. 5 is a detailed electrical diagram of the RAM 25, RAM page decoder 29 and RAM write control 70 of FIG. 3.
Figure 21:
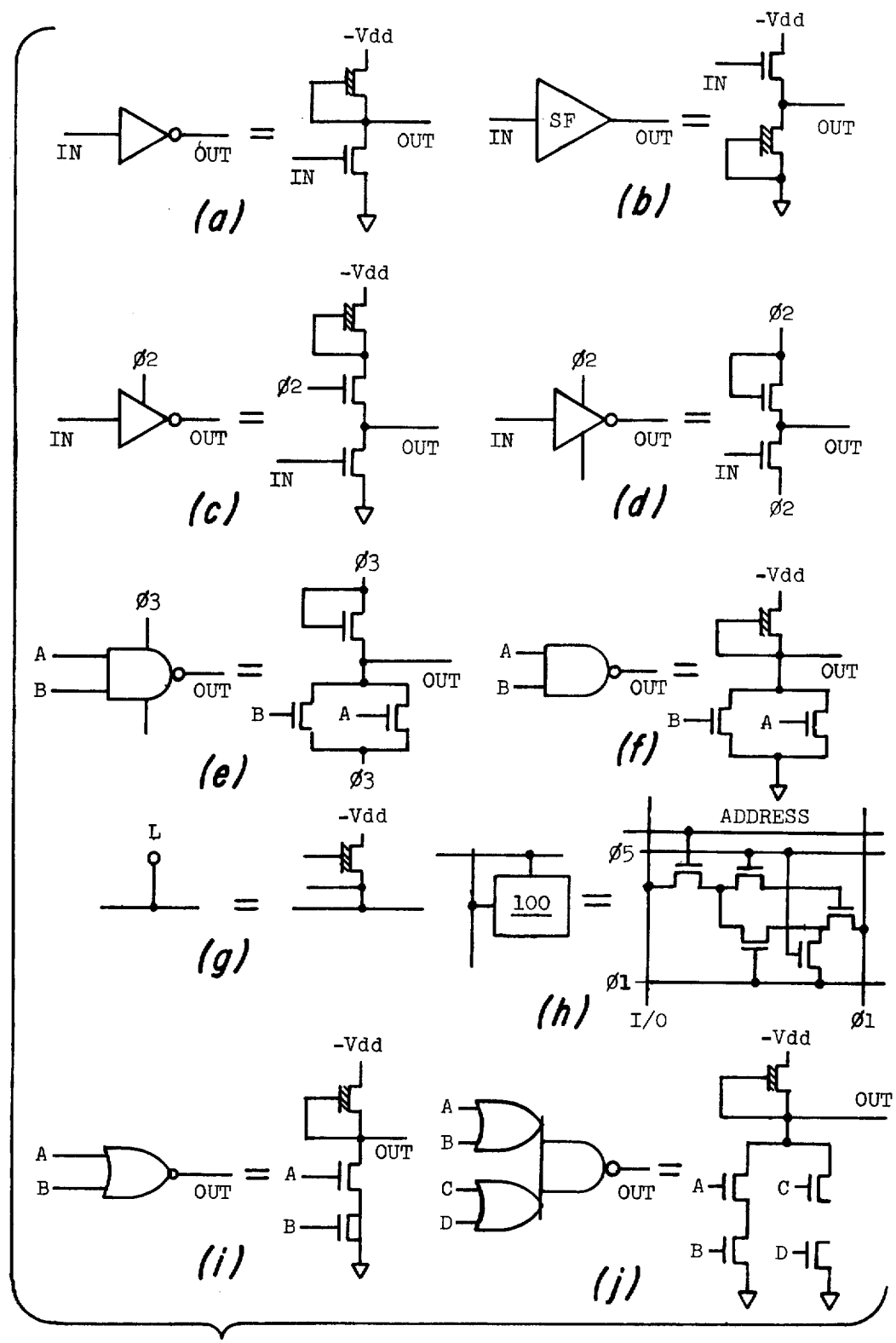
FIGS. 21a to 21j are detailed electrical diagrams of logic circuits used in FIGS. 5-20.

Referring to FIG. 5, the RAM 25 and its input/output control circuitry is illustrated. The RAM 25 is composed of an array of 256 cells 100, each of which is a self-refreshing memory cell as seen in FIG. 21h, and as described in copending U.S. patent application Ser. No. 454,349, filed Mar. 24, 1974, now U.S. Pat. No. 3,876,993 or Ser. No. 525,245 filed Nov. 19, 1974, now U.S. Pat. No. 3,955,181 both assigned to Texas instruments Incorporated; such applications are incorporated herein by reference. The array is organized 16 × 4 × 4, wherein 16 address lines 26 provide the "RAM Y" address function; that is, the 4-bit indication usually contained in RAM Y register 40 is decoded in the decoder 27 to select one of the 16 lines 26. These lines are labelled 26-0 to 26-15, representing the A0 to A15 signals, thirteen of which also correspond to the D0 to D12 signals. The array of RAM 25 also includes sixteen data input/output lines 101, these being labelled 101-1 to 101-16; these are arranged in four groups of four, 101-1 to 101-4 being one group, etc. The two-bit RAM X address on lines 28 selects one-of-four of the lines 101-1 to 101-4, ect., in each group, and causes the four selected lines, one from each group, to be connected to four input/output lines 30-1, 30-2, 30-4 and 30-8 which correspond to the 1, 2, 4 and 8 lines for a 4-bit BCD code. Note that for simplicity only some of the cells 100 and representative address and input/output lines are shown in FIG. 5; also, the $\phi 1$ and $\phi 5$ lines needed for each cell in the array are not shown in the Figure.

The RAM page decoder 29 comprises four like groups of transistors 102 which receive the true and inverted RAM X address signals from lines 28 and enable paths such that only one of the lines 101 in each group of four is connected to the respective one of the lines 30. If a code "01" exists on lines 28 then lines 101-1, 101-5, 101-9 and 101-13 would be connected to the lines 30-1, 30-2, 30-4 and 30-8 respectively. A code "11" would select lines 101-2, 101-14, etc.

The RAM I/O circuitry 31 comprises four like groups 31-1 . . . 31-8, each of which controls read or write for one bit. Each of the lines 30 is connected to one of the write lines 71 through one of four series transistors 103 which are clocked on $\phi 3$, so that data reaches the lines 30 for write in during the significant interval $\phi 5$, when it must exist on the selected line 101. Phase $\phi 3$ is wider than needed for this purpose as may be seen in FIG. 4. The lines 30 are shorted to Vss during 2 by devices 104 which are clocked on $\phi 2$, so that all I/O lines 101 are at Vss or logic "1" at the beginning of each cycle. Data is read out of 16 selected cells 100 onto lines 101 during $\phi 1$, then four selected lines 101 are read onto the four lines 30-1 . . . 30-8 at this $\phi 1$ time. For read out, the data goes through devices 105 which are clocked on $\phi 4$ during $\phi 1$ time, into the gates of transistors 106. Transistors 107 precharge the output lines 32-1 to 32-8 during $\phi 2$, and the output lines are conditionally discharged via devices 106 during the next $\phi 4$ ($\phi 1$) time. Thus the selected data will appear on read-out or recall lines 32-1 . . . 32-8, valid during $\phi 4$ ($\phi 1$) time interval 92. The gates of transistors 106 will be shorted to Vss through devices 104 and 105 during the interval 95 of $\phi 4$, when $\phi 2$ is also on.

The lines 101 are shorted to Vss during $\phi 2$ by devices 108 during intervals 95 and 96, since it is necessary for the lines to be at Vss before read-out which occurs during interval 92 of the next cycle. All the address lines 26 are at Vss during $\phi 2$; this is implemented in the address decoder 27 such that an address or -Vdd exists on only one of the lines 26 only during $\overline{\phi 2}$, and at all other times all of the lines 26 are at Vss. Only one address line 26 can be on at a given time.

The RAM write control 70 includes four like circuits 70-1 . . . 70-8, only two being seen in FIG. 5, which receive data inputs 53-1, 53-2, 53-4 and 53-8 from the accumulator 52, and also receive four data or control inputs 55-1 to 55-8 from the CKB logic 56. Transistors 109 are under control of the voltage in a control line 110 when a "STO" command appears on an outpput line 61-12 from data path control PLA 60. This can be valid only when $\phi 2$ is not at -Vdd as implemented in a gate 111. Transistors 112 are under control of the voltage on a control line 113 when a "CKM" or CKB-to-memory command appears on another output line 61-11 from PLA 60, also rendered valid only when $\phi 2$ is not at -Vdd by a gate 114. By these devices 109 and 112, the accumulator outputs 53 or the CKB data outputs 55 can be inputs to the memory. The other CKB function is also implemented on the control 70. Output signals $\overline{SETB}$ and $\overline{RSTB}$ appearing on command lines 61-17 and 61-18 as outputs from the control PLA 60 are applied to the gates of transistors 115 and 116 to produce 1 and 0 (Vss and Vdd) voltages, respectively. Transistors 117 in series with transistors 115 and 116, controlled by CKB outputs 55, provide the set and reset bit functions. Device 115 produces a ground or logic 1 on input line 71 to the RAM if $\overline{SETB}$ is at -Vdd, for the one of four bits selected by the CKB lines 55. Likewise, device 116 produces a logic O on input line 71 if $\overline{RSTB}$ is at -Vdd, for the selected bit. Only one of the CKB lines 55 can be at -Vdd when CKB is functioning in the bit mode, the others are at ground which turns off transistors 117 for unselected bits. This permits setting or resetting a specific bit in the RAM 25. This function is typically used for setting and resetting flags in calculator operation; a digit may be designated for flags, with one bit each as the add flag, minus flag, multiply flag and divide flag, for bookkeeping. Later, a specific flag bit is accessed via masking the adder inputs, again with CKB. Testing flags is by the compare function in the adder. This mechanism simplifies the structure in that the same controls and select that are used in arithmetic functions are used in the test bit functions.

THE ADDER

Figure 6:
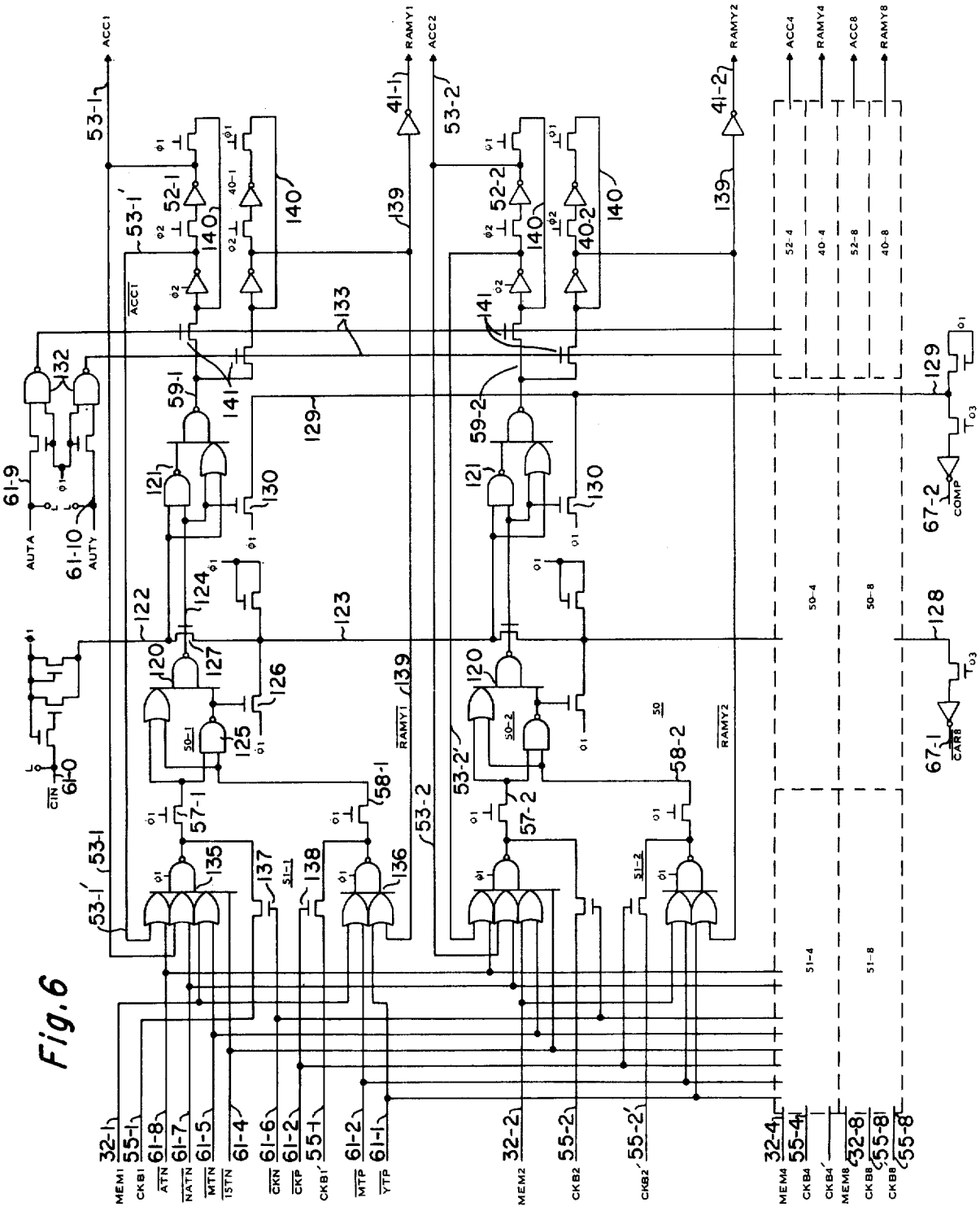
FIG. 6 is a detailed logic diagram of the adder 50, adder input select 51, accumulator 52 and RAM Y register 40 of FIG. 3.

The binary adder 50 consists of a set of four parallel adder stages 50-1, 50-2, 50-4 and 50-8 of conventional form. All four of the stages are basically the same; two are shown in FIG. 6. Considering the stage 50-1, each adder stage consists of a first complex gate 120 and a second complex gate 121, a carry input 122 and a carry output 123. The complex gate 120 receives two inputs 57-1 and 58-1, sometimes identified as negative and positive inputs, and produces an output on line 124 which is the "exclusive or" or "equivalence" function of the inputs on 57-1 and 58-1. A carry output is produced on the line 123 by first precharging the line 123 to a O or Vdd on $\phi 1$, then conditionally discharging when $\phi 1$ goes to Vss, depending upon the output of a gate 125; when both inputs 57-1 and 58-1 are 1, one generate condition for generating a carry is satisfied, so the output of gate 125 causes the device 126 to be conductive after $\phi 1$ ends, discharging line 123 to Vss or 1. A carry signal is produced on line 123 going to the next stage if both inputs 57-1 and 58-1 are 1, or if either of these is 1 and "carry in" on line 122 is 1, or if both inputs 57-1 and 58-1 are 1 and "carry" in on line 122 is 1, for all other situations, the line 123 remains at O or -Vdd after $\phi 1$ ends since neither the path through device 126 or through a device 127, nor the next stage, permits a discharge. The carry input for the first bit comes from a $\overline{CIN}$ command from the control logic 60 via a line 61-0; the line 122 is also precharged with $\phi 1$. Carry output from the stage 50-8 appears on line 128, is gated on $\phi 3$ and inverted, and provides a $\overline{CAR8}$ signal on line 67-1 which goes to the status logic 66.

The adder 50 provides a "compare" function, wherein a COMP output is produced on a line 67-2 which also goes to the status logic 66. This signal is produced on a line 239 which is precharged by $\phi 1$ then conditionally discharged on $\overline{\phi 1}$ when any of the devices 130 are turned on by the outputs 124 of the gates 120. Conditional discharge occurs if line 124 goes to -Vdd, which occurs if the inputs to complex gate 120 at 57-1 and 58-1 are not the same. When all of the inputs 57 are the same as the inputs 58, COMP will be 1, otherwise O.

Outputs from the adder stages 50-1, 50-2, etc., are produced on lines 59-1, 59-2, 59-4 and 59-8, which are the outputs of the complex gates 121. The gates 121 receive inputs 124 and carry in for that bit on lines 122, etc. The gates 121 produce an "equivalence" function of the outputs 124 and carry in. During $\phi 1$, these outputs 59 are not valid, because the carry circuit is being precharged. Carry is not valid, so the outputs 59 are not valid, until after $\phi 1$ ends. The adder output 59-1 is an input to either the accumulator register stage 52-1 or the RAM Y register stage 40-1, depending upon inputs 61-9 and 61-10 from the control PLA 60 referred to as AUTA and AUTY. These controls go through inverting gates 132 which also have $\phi1$ inputs, providing control lines 133 which can be at -Vdd only during $\phi1$.

THE ADDER INPUT SELECT

As shown in FIG. 6, the adder input select 51 includes four similar sets of complex gating arrangements 51-1, 51-2, 51-4 and 51-8 each consisting of complex NAND/NOR gates 135 and 136. The gate 135 receives control inputs 61-4, 61-5, 61-7 and 61-8 from the control PLA 60, referred to as $\overline{15TN}$, $\overline{MTN}$, $\overline{NATN}$ and $\overline{ATN}$, which determine whether the input 57-1 will be either unconditional 1, or $\overline{MEM1}$, or $\overline{ACC1}$, or ACC1, respectively. The data from the RAM 25 appears on lines 32-1, 32-2, etc., from FIG. 5, and is referred to as $\overline{MEM1}$, $\overline{MEM2}$, etc. The data from the accumulator 52 appears on lines 53-1 and 53-1' in true and inverted form, ACC1 and $\overline{ACC1}$ as inputs to the selector 51, so either the accumulator data or its complement may be the adder input. The inputs from the CKB logic 56 are provided on CKB1, $\overline{CKB1'}$, et seq., lines 55-1, 55-1', etc., which bypass the gates 135 and 136.

The CKB inputs are controlled by $\overline{CKP}$ and $\overline{CKN}$ through devices 137 and 138. The control signals $\overline{YTP}$ and $\overline{MTP}$ on lines 61-1 and 61-2 select either $\overline{RAMY}$ from a line 139 or MEM1 from line 32-1 as the input 58-1 via gate 136.

THE ACCUMULATOR AND RAM Y REGISTERS

FIG. 6 also shows the accumulator register 52 which contains four like stages 52-1, 52-2, 52-4 and 52-8, as well as the RAM Y register which has four like stages 40-1 to 40-8. Each stage of these registers is a conventional one-stage shift register which recirculates upon itself via paths 140, so bits entered into ACC or RAM Y will stay until new data is entered. The stages each consist of two inverters and two clocked transfer devices, clocked on $\phi2$ then $\phi1$, of conventional form. Selection of whether the adder outputs 59 go to ACC or RAM Y is made by AUTA and AUTY commands on lines 61-9 and 61-10, which produce controls on lines 133 for devices 141. Data is valid at the outputs 59 from the adder 50 after $\phi1$ goes to Vss, so the lines 133 do not go to -Vdd until after $\phi1$; this is the function of gates 132.

The outputs 41-1, 41-2, etc., and 139 from RAM Y are valid after $\phi1$ ends. The true outputs 53-1, 53-2, etc., and inverted outputs 53-1', etc., from the accumulator are valid starting at $\phi2$.

THE DATA PATH CONTROL PLA

Figure 7:
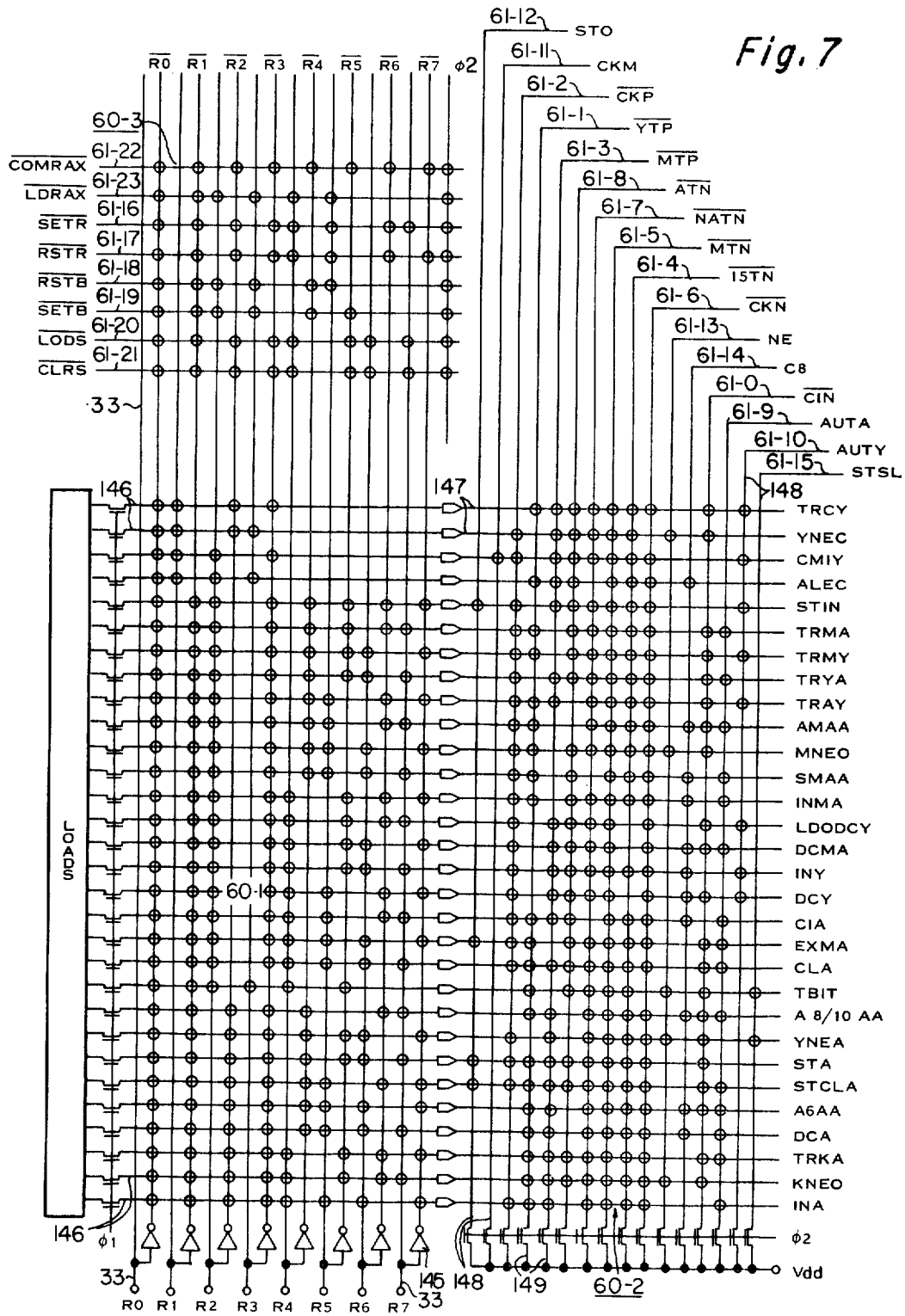
FIG. 7 is a detailed logic diagram of the control PLA 60 of FIG. 3.

The control PLA 60 is shown in detail in FIG. 7. This device basically consists of a programmable logic array of the type described in U.S. Pat. No. 3,702,985, Probesting et al, assigned to Texas Instruments Incorporated.

The current instruction word from the ROM 24 is applied in true and inverted form to the first section 60-1 of the PLA. These are the outputs 33 from the ROM corresponding to R0, $\overline{R0}$, R1, $\overline{R1}$, etc. The lines 33, etc., are metal strips. Inverters 146, precharged on $\phi2$, produce the inverted $\overline{R0}$, etc., signals. Thirty lines 146 in the first section 60-1 are elongated P-diffused regions, and each is connected to Vdd through a separate load device. All of the lines are clocked on $\phi1$. Between adjacent lines 146 is a Vss line, also a P-diffusion. The circles represent thin oxide gate areas, so where a circle is present a line 146 is connected to Vss when the overlying metal line 33 is at -Vdd, otherwise it stays at -Vdd. The coding of the PLA section 60-1 by gates or circles is such that only one line 146 is actuated or at -Vdd for a given instruction code on lines 33. The lines 146 become metal strips 147 in the second section 60-2 of the PLA. Another set of sixteen P-difussed lines 148 underlie the metal strips 147, along with Vss lines (not shown). Again, the circles represent thin oxide gates under the metal strips. The coding is such that for the one-of-thirty lines 147 which is actuated, a selected set of lines 148 will be actuated with the proper 1 or O logic level. The coding shown is for one example calculator operation. Both sections 60-1 and 60-2 are mask programmable in manufacture, so many different instruction sets are possible. The lines 148 contain the same commands as lines 61-0 to 61-15.

Note that for any instruction word where R0=1, a branch or call is being implemented, so none of the lines 147 will be actuated because no elements in the entire system controlled by lines 61 should be exercised. The $\overline{R0}$ line 33 is first section 60-1 has gates for every line. All of the output lines 148 or 61-0 to 61-15 from the second section 60-2 are precharged to -Vdd by devices 149 clocked on $\phi2$; these lines 61-0 to 61-15 are diffused regions while within the section 60-2 and then become metal strips for connection to the adder select, etc., on other parts of the chip. A third section 60-3 of the control PLA 60 is a simple decoder rather than a PLA. This decoder produces register and bit set and reset commands, load or clear segment commands, and load or complement RAM X address commands, all on lines 61-16 to 61-23 which are P-diffused regions. Loads, not shown, are connected to those lines. Particular ones of these lines are selected according to the gate coding and the current instruction word.

THE STATUS LOGIC AND STATUS LATCH

Figure 8:
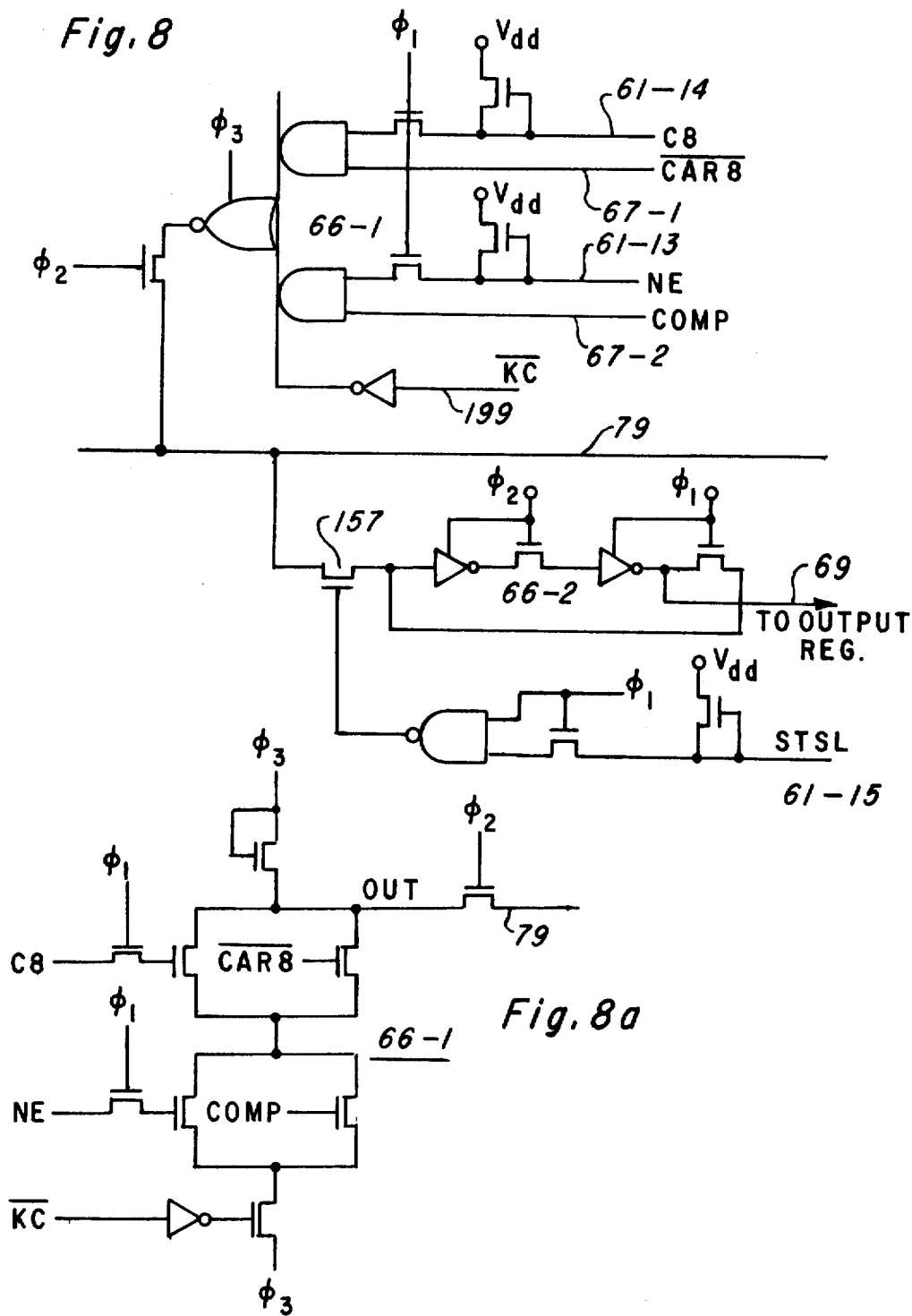
FIG. 8 is a detailed logic diagram of the status logic 66 of FIG. 3.

In FIG. 8, the status circuitry 66 is shown in detail, including a complex gate 66-1 for resetting status line 79, and a status latch 66-2. Status is normally a logic 1, so the machine normally branches, unless status line 79 is reset to logic O or -Vdd. The latch is a conventional circuit with two clocked inverters and a feedback path. The output 69 from the status latch 66-2 is connected to the output register 62. The latch may be set or reset, i.e., the line 79 connected to the latch input via device 157 under control of an STSL command on line 61-15 from the control PLA 60, and $\phi1$. The output of status logic 66-1 (valid beginning at the last half of $\phi2$) is applied to device 157 via line 79, which is also connected to various gates in FIG. 11. Status logic 66-1 is a dynamic OR gate clocked on $\phi3$, and produces an output under three situations. One is "clear"; when the clear key is closed, $\overline{KC}$ occurs on line 199, status signal is produced on line 79, meaning that the line remains at -V for one instruction cycle. Another is the occurrence of a $\overline{CAR8}$ signal on line 67-1 from the adder 50, FIG. 6; this, coupled with a C8 command on line 61-14 from the control PLA 60 generates "status" on line 79. In either case the status latch can be set if STSL occurs on the same instruction cycle. Thus, a carry output from the 8 bit of the adder can be used to generate status on line 79 and/or set status latch. Likewise, a COMP output from the adder 50 on line 67-2 can be used to generate status if an NE command also occurs on line 61-13 from the control PLA 60, so if the adder is used to compare two data inputs then the result can be used to generate "status" on line 79, and/or to set the status latch.

Figure 8A:
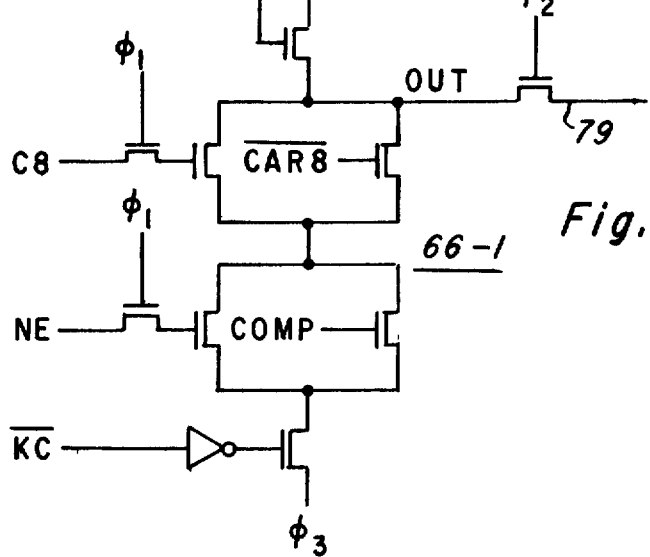
FIG. 8a is a detailed electrical diagram of a complex gate 66-1 of FIG. 8.

FIG. 8a shows the complex gate 66-1 in schematic diagram form rather than as a logic diagram. Note the output is precharged to -Vdd during $\phi 3$, and will conditionally discharge depending upon the logic inputs after $\phi 3$ goes to Vss, during which $\phi 2$ is at -Vdd.

GENERATING THE ROM ADDRESS

The ROM word and page addresses are generated in several alternative ways, employing the program counter 36, the subroutine register 43, the ROM page address register 46 and buffer 47, as well as the controls 48 and the ROM output itself on line 33. These elements will now be described.

THE PROGRAM COUNTER

Figure 9:
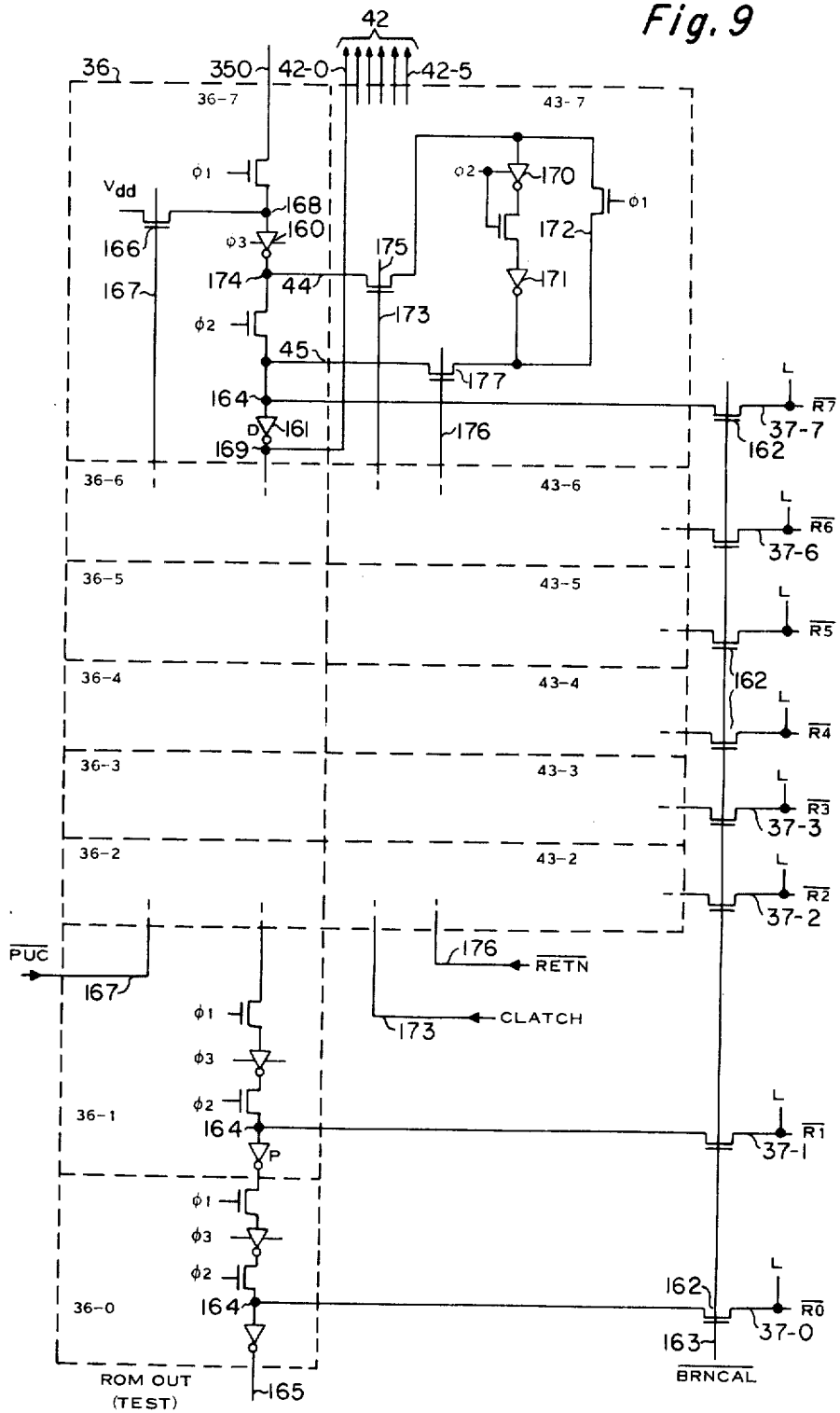
FIG. 9 is a detailed logic diagram of the program counter 36 and subroutine register 43 of the system of FIG. 3.

Referring now to FIG. 9, the program counter 36 includes eight stages 36-0 to 36-7, each of which is a register stage having two inverters 160 and 161, clocking being at $\phi 1$, $\phi 2$, with precharge on $\phi 3$ for power saving. Only six stages of the program counter are used in the normal operation of the unit, these being stages 36-2 to 36-7 which receive the $\overline{R2}$ to $\overline{R7}$ ROM outputs from lines 33 via lines 37-3 to 37-7. The six-bit address on $\overline{R2}$ to $\overline{R7}$ is gated into the stages 36-2 to 36-7 by devices 162 when a $\overline{BRNCAL}$ "branch or call" signal appears on line 163 coming from controls 48. This means that a successful branch or call operation is being performed so that part of the instruction code which defines the branch address is loaded into the program counter by the path just described.

The two extra stages 36-0 to 36-1 in the program counter unused in regular operation, are employed for test purposes. All eight bits of the ROM output on lines 33, inverted and appearing as $\overline{R0}$ to $\overline{R7}$, may be loaded into all eight stages of the program counter via lines 37-0 to 37-7 by gates 162 under control of a $\overline{BRNCAL}$ signal on line 163, to appear on nodes 164 from whence the 8-bit word is read out serially via a terminal 165 during the next eight instruction cycles.

All of the stages 36-2 to 36-7 may be set to zero for power-up-clear by devices 166 which are turned on when a $\overline{PUC}$ command appears on a line 167, thus connecting a node 168 in each stage to Vdd. In this manner, a ROM word address of 000000 is generated on lines 42.

The six outputs from the program counter stages 36-2 to 36-7 to the ROM address decoder are via six lines 42-0 to 42-5, representing PC0 to PC5 signals. These are obtained at nodes 169 in each stage. Note that an address $\overline{R2}$ to $\overline{R7}$ on lines 33, when gated through devices 162, passes immediately through nodes 164, inverters 161, and nodes 169, to lines 42-0 to 42-5 without clocking delays.

THE SUBROUTINE REGISTER

In FIG. 9, the subroutine register 43 comprises six identical stages 43-2 to 43-7 corresponding to program counter stages 36-2 to 36-7. Each subroutine register stage includes two inverters 170 and 171, and a feedback loop 172, with gates clocked at $\phi 2$ and $\phi 1$. A bit, once entered, will recirculate continuously. When a "CLATCH" command is generated on a line 173 from control 48, the contents of the program counter 36 as appearing on nodes 174 will be loaded into the respective stages of the subroutine register 43 via devices 175; this must occur on $\phi 2$. Normally, the control line 173 is always on, so the contents of the program counter as normally sampled into the subroutine register via devices 175 on every machine cycle. But when a CALL is executed, the command is "don't load", so the last address is kept. The 6 bits thus loaded into the subroutine register will thereafter continue to recirculate individually within the stages 43-2 to 43-7, until such time as a $\overline{RETN}$ command appears on a line 176 from control 48. This would cause devices 177 to load the 6 bits back into nodes 164 of the program counter stages 36-2 to 36-7, and thence immediately through inverters 161 to nodes 169 and output lines 42. At the same time, CLATCH goes negative so devices 175 thereafter load address bits into the subroutine register until another CALL mode is reached.

THE ROM PAGE ADDRESS REGISTER AND BUFFER

Figure 10:
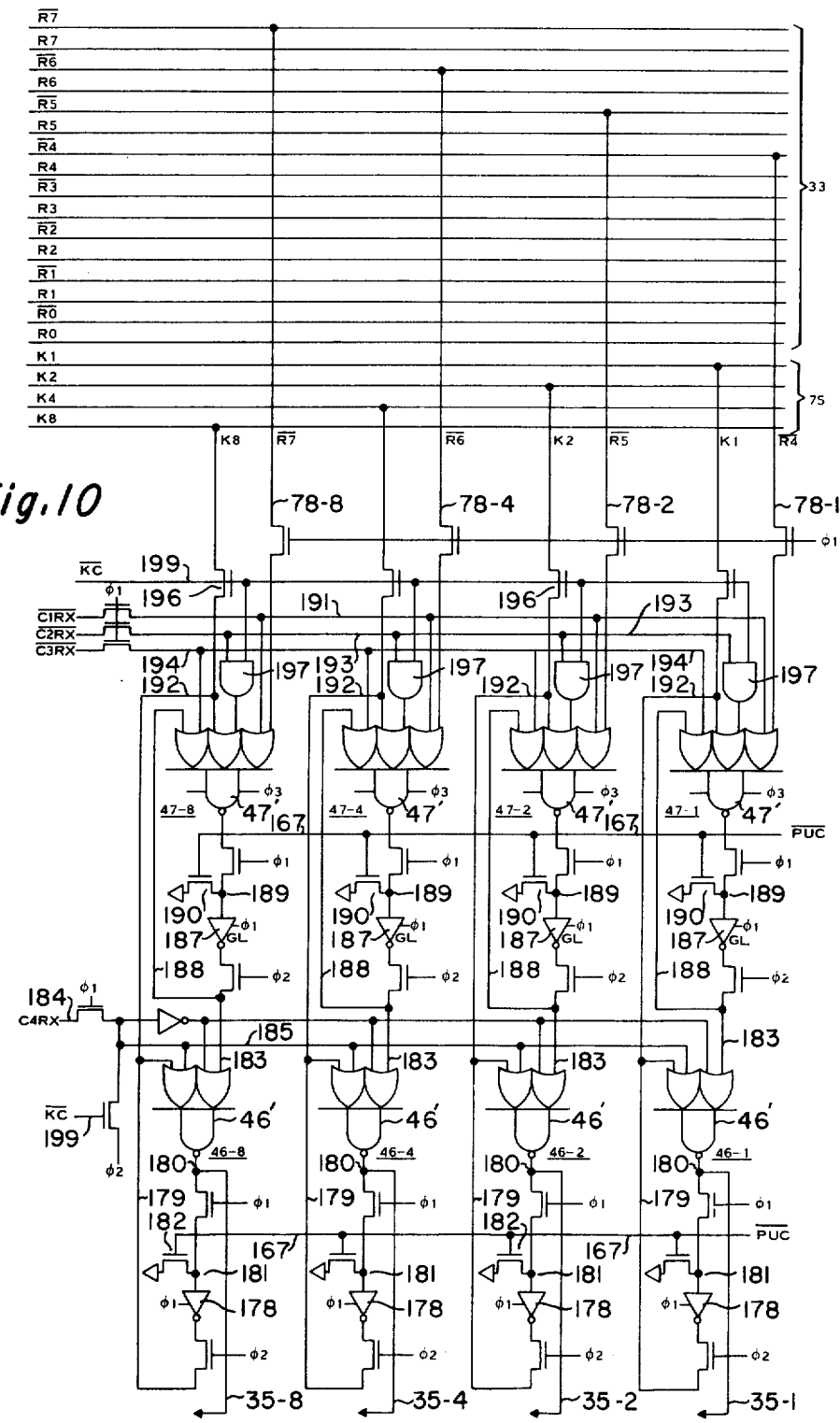
FIG. 10 is a detailed logic diagram of the page address register 46 and the address buffer 47 of FIG. 3.

Referring to FIG. 10, the ROM page address register 46 comprises four stages 46-1, 46-2, 46-4 and 46-8, each of which includes a complex gate 46' and an inverter 178, along with a recirculate path 179 and devices clocked at $\phi 1$ and $\phi 2$. Output from the register 46 is via four lines 35-1, 35-2, 35-4 and 35-8 from nodes 180, going to the ROM page decode in the ROM 24, valid during $\phi 2$. For power-up-clear, all of the nodes 181 may be connected to Vss by devices 182 under control of the $\overline{PUC}$ command on line 167 as previously mentioned. This ultimately produces a 11110 page address on lines 35. Input to the gates 46' can be from lines 183 which are outputs from the buffer register 47, when a C4RX command appears on a line 184 from control 48. Normally, however, the page address is recirculating. The $\overline{KC}$ command, normally at Vss, block $\phi 2$ from driving line 185 to -Vdd.

The buffer register 47 includes four register stages 47-1 to 47-8, each stage including a complex gate 47' (precharged at $\phi 3$) and an inverter 187, with transfer gates clocked at $\phi 1$ and $\phi 2$, and a recirculate path 188. As before, a power-up-clear command on line 167 will connect all nodes 189 to Vss via devices 190, to clear the buffer register.

Inputs to the buffer register stages 47-1 to 47-8 via complex gates 47' may be from several sources. First, the ROM outputs R4, R5, R6, R7 on lines 33 may be loaded into the buffer via lines 78-1 to 78-8 when a C1RX command is produced on line 191 from the controls 48 (an instruction word of 0001XXX), both of these inputs to gates 47' being gated in on $\phi 1$. Second, the output from the ROM page address register 46, appearing on lines 192, will be the input to gates 47' when a C2RX command appears on line 193 from control 48, gated on $\phi 1$; this occurs for a CALL when status is at logic 1. Third, the buffer stages may be caused to recirculate upon themselves by loops 188 when a C3RX command appears on line 194 from control 48; this occurs whenever C1RX or C2RX are both at Vss, i.e., the register 47 usually recirculates except when an address is being loaded from R4-R7, or a successful CALL is being implemented. In the test mode A KC signal on line 199 can cause the keyboard input lines K1 to K8 to be input to the gates 46' via transfer devices 196 and lines 192; this is used for test or in functions other than calculator functions. Also, -Vdd on the clear key line $\overline{KC}$ produces an input to gates 197 which are parts of the complex gates 47', to essentially disable any control by the $\overline{C2RX}$ command on line 193, breaking the path that loads the outputs 35 into 47 via lines 192;

this provides a hardware clear function and other alternatives.

Generally, the registers 46 and 47 contain the same data, meaning addresses are being used which are on the same "page" in the ROM. All the branches are to the same page. However, to go to a different page, i.e., a long branch, a new page address is loaded in from R4-R7 to register 47. This results in the current address being in register 46 and on lines 35, and the new page address to go in register 47. If the branch is true or status condition satisfied, register 47 is transferred to register 46 and thus to lines 35. At this point, the same data is again in registers 46 and 47, so the machine is set up to do short branches again on the new page. If a CALL is executed, register 47 is transferred to register 46, and vice versa. Of course, if the call is on the same page, the data is the same in each register anyway. But if it is a long call, to a different page, then register 47 functions to store the address of the page existing at the time the CALL is initiated. So, when a return is executed, register 47 is transferred to register 46, the two registers again have the same data, and the machine is at the initial address, set up for short branches.

THE ADDRESS CONTROLS

Figure 11:
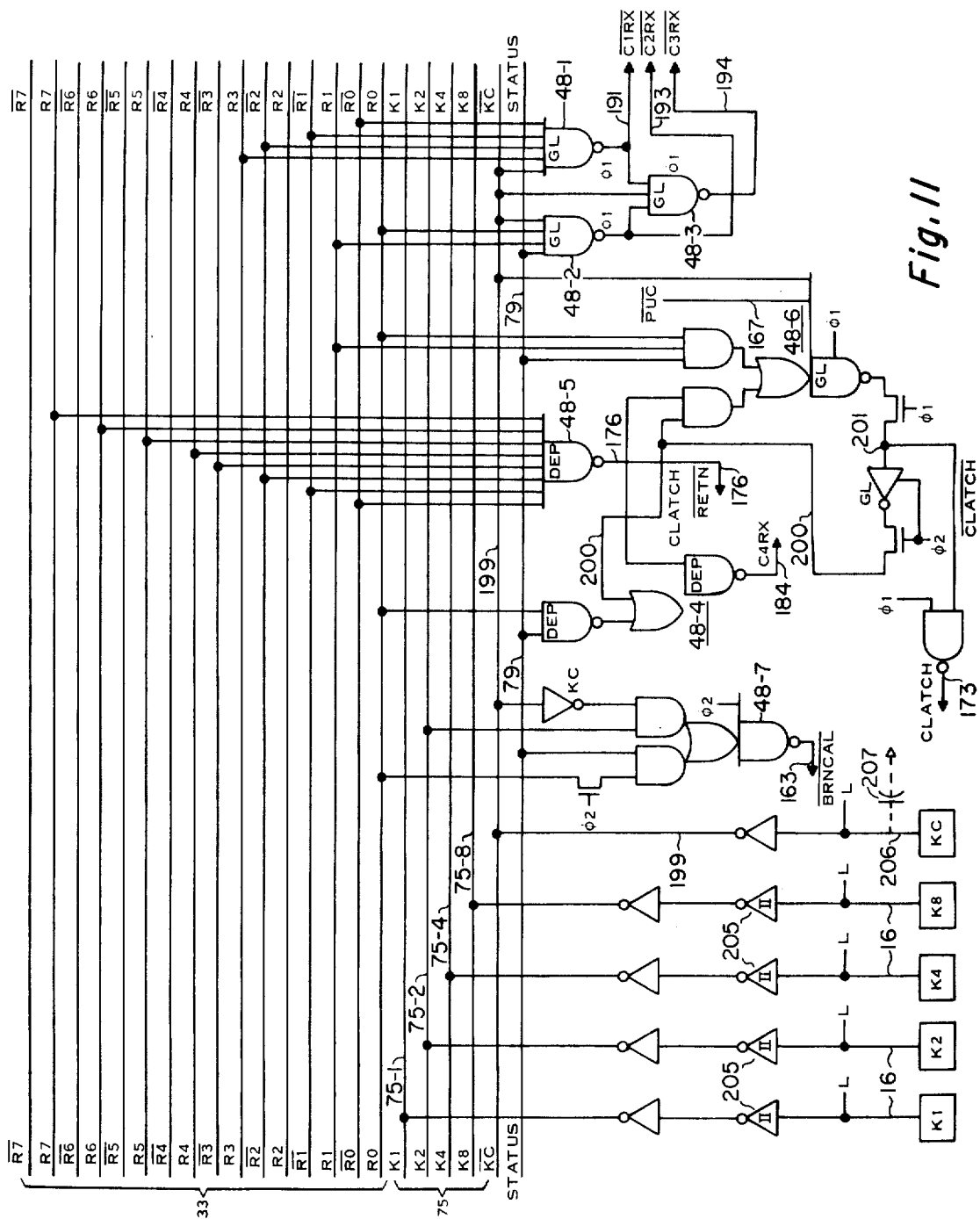
FIG. 11 is a detailed logic diagram of the address controls 48 and keyboard input 75 of the system of FIG. 3.

Referring to FIG. 11, the control 48 for the ROM addressing circuitry includes several separate complex gates 48-1, 48-2, etc., for generating the various commands. The gate 48-1 produces the $\overline{C1RX}$ command on line 191 in response to the presence of R0, R1, R2 and R3 on lines 33, along with the $\overline{KC}$ input on a line 199 being at Vss. This loads in a new page from R4-R7 on lines 33 for a long branch or call. A gate 48-2 produces the $\overline{C3RX}$ command on line 193, in response to the presence of R0, R1 on lines 33, $\overline{KC}$ on line 199, and a "status" signal on line 79 from status logic 66; all these must be at Vss for $\overline{C3RX}$ to be at -Vdd. This means that a 11XXXXXX instruction word is on lines 33 and status is at logic 1. This is a CALL. The $\overline{KC}$ input to gates 48-1, 48-2 and 48-3 functions to disable all these gates when the clear key is pressed. A gate 48-3 produces the $\overline{C3RX}$ command on the line 194 in response to $\overline{KC}$ on line 199 and the $\overline{C1RX}$ and $\overline{C2RX}$ commands at the outputs of gates 48-1 and 48-2 all being at Vss. This says recirculate the register 47 via lines 188, i.e., save the address in the buffer register. A gate 48-4 produces the C4RX command on the line 184 as a function of "status" on line 79, R0 from the lines 33, the $\overline{RETN}$ signal on line 176, and a signal derived from $\overline{CLATCH}$, appearing on a line 200. Whenever a return is executed, C4RX should go to Vss, so register 47 can be loaded into register 46 via lines 183. The $\overline{RETN}$ command 178 is produced by a gate 48-5 in response to $\overline{R0}$, $\overline{R1}$, $\overline{R2}$, $\overline{R3}$, R4, R5, R6, R7 on lines 33; that is, an instruction code of 00001111 results in a $\overline{RETN}$ command, recalling the address in the subroutine register 43 to the program counter 36 and thus to the lines 42 going to the decode select 39, as well as loading register 47 into register 46. The CLATCH command is produced from a complex gate 48-6, which is responsive to "status" on line 79, R0 and R1 from lines 33, $\overline{RETN}$ on line 176, $\overline{KC}$ on line 199, and the power-up-clear signal $\overline{PUC}$ on line 167. A function of CLATCH is to disable the path 183 from register 47 to register 46 when a CALL is executed. This is done by line 200 going to gate 48-4, which is also responsive to R0 and status being at Vss. By line 184, and line 185, the recirculate path 179 for register 46 is enabled in gates 46' while the path 183 is disabled. R0 and status being 1 are a successful branch or call, and would cause transfer of register 47 to register 46, but CLATCH says don't do it. CLATCH is normally in the non-CALL mode, saying that the machine is not calling but is branching. If R0, R1 and status are 1 into gate 48-6, it means a valid CALL, so the latch is set into CALL mode. The $\overline{RETN}$ instruction says leave the CALL mode, and reset the latch. $\overline{KC}$ or $\overline{PUC}$ also reset the latch. The inverter and gate between node 201 and the line 200, along with the gate 48-6, provide a feedback loop and thus a latch function, so that when CLATCH is produced it will subsist until return $\overline{RETN}$, hardware clear $\overline{KC}$, or power-up-clear $\overline{PUC}$ occurs. The $\overline{BRNCAL}$ command on line 163 is produced in a gate 48-7, which is responsive to R0 and "status". The gate 48-7 looks for a successful branch or call; the word address transfer is always implemented when R0 is 1 and status is 1.

In the test mode, the $\overline{KC}$ and K2 inputs to gate 48-7 are functional. Normally KC is negative so K2 is out of the circuit. If KC is at Vss, then K2 can control $\overline{BRNCAL}$. In test mode, after serially loading in an address on the K1 line, then if K2 is grounded a $\overline{BRNCAL}$ command is produced. This forces all eight ROM bits from lines 33 into the program counter 36 via devices 162 in FIG. 9, from whence the bits are transferred out via line 165 for testing. $\overline{BRNCAL}$ is grounded on $\phi2$ in gate 48-7, so it is valid during $\phi2$.

THE KEYBOARD INPUT

Also shown in FIG. 11 are the keyboard input lines 75 which come from the inputs 16. Schmidt trigger circuits 205 are used between the lines 16 and the lines 75 to impose a threshold and hysteresis effect. While referred to as a keyboard input, and used as such for calculators, it is understood that BCD or binary data may be entered directly into the lines 16 from any source when the digital processor chip of the invention is used for other purposes. Note that true data is a 1 or Vss level, and at other times the lines 16 and thus lines 75 will be held at 0 or Vdd by depletion load devices L. The KC line 206, used for hardware clear or the "clear" key in calculator applications, is connected through an inverter to the $\overline{KC}$ line 199; when the clear key is up, $\overline{KC}$ will be at Vss or 1, and when the clear key is depressed, line 206 will be grounded and line 199 will go to -Vdd. An external capacitor 207 may be used with the chip to provide a delay and smoothing or debounce function for the KC input.

Generally, in using the processor chip as a calculator, numerical data is not entered via the keyboard inputs in the form of numerical data; that is, when a 7 key is depressed, a BCD 7 or 0111 is not generated on the K lines, but instead typically a sequence of programming steps is employed to detect that a key is down, then store the K line information in the accumulator 52 while the identity of the line 18 which is actuated is stored in the Y register 40. This data may then be used to identify the key by software and enter a BCD number in the RAM 25 or execute an operation.

An advantage of this input system is that numbers and operations may be intermixed on the K lines, and the numbers need not be in numerical order. Also, two keys might be pushed at the same time, and one may be rejected by software. Further fixed switches as for DPT position may be intermixed with momentary switches. None of these could be done in prior machines.

Except for testing mode, the keyboard inputs go to the CKB logic 56 only. From there, the keyboard can be loaded into the accumulator or RAM Y registers.

THE CONTROL-KEYBOARD-BIT LOGIC

Figure 12:
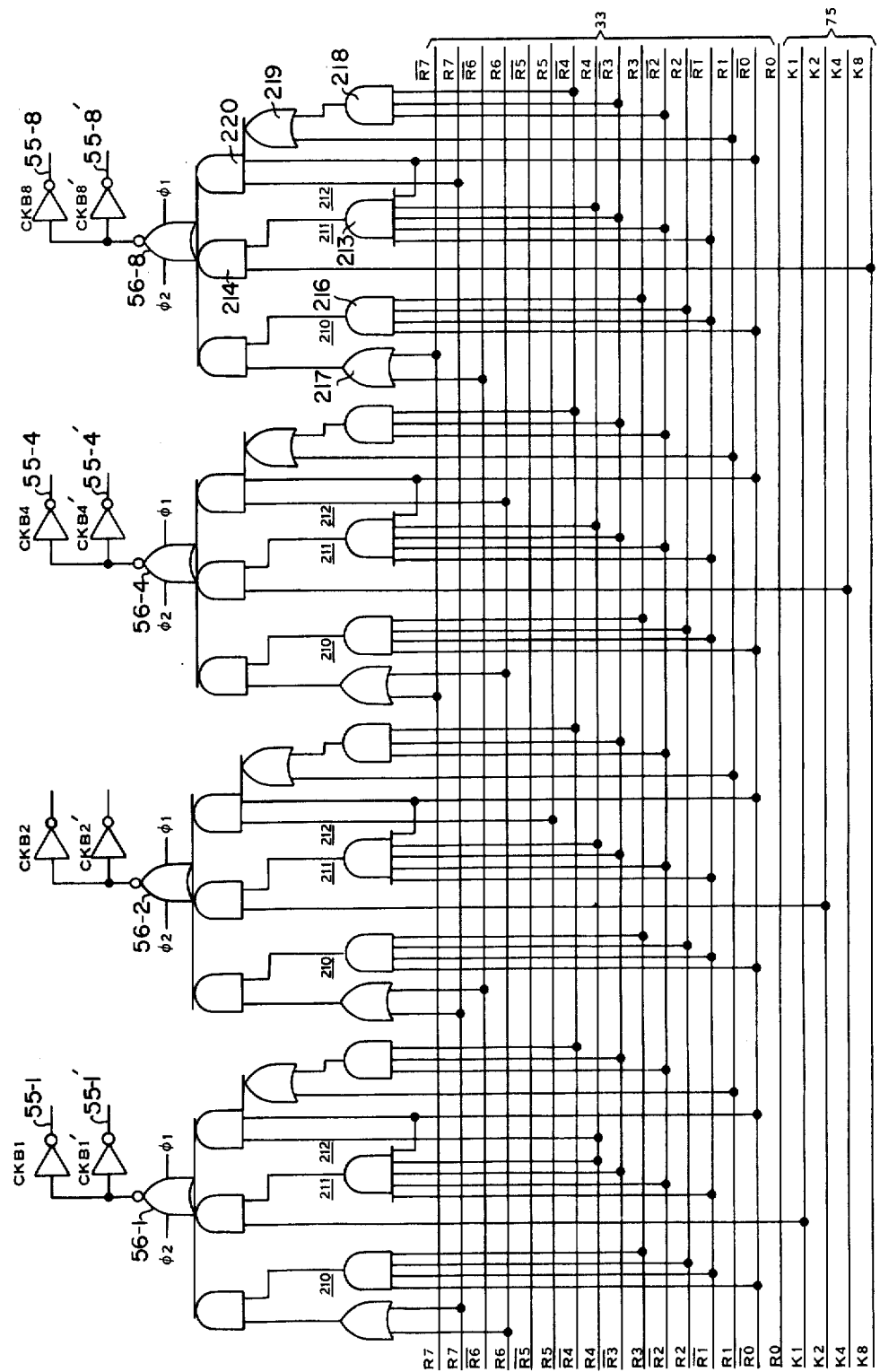
FIG. 12 is a detailed logic diagram of the CKB logic 56 of FIG. 3.

The CKB logic 56 shown in FIG. 12 consists of four identical complex gates 56-1, 56-2, 56-4 and 56-8 which produce the $\overline{CKB1}$ to $\overline{CKB8}$ outputs on lines 55-1 to 55-8. The CKB outputs are applied to the adder input select 51 and to the RAM Write control 70, as explained. Each of the four complex gates 56-1 to 56-8 contains three separate gating arrangements 210, 211 and 212, each of which will produce a CKB output under certain conditions, dependent upon the current instruction word on lines 33. The gating arrangements 211, in each case, receive $\overline{R0}$, $\overline{R1}$, $\overline{R2}$, $\overline{R3}$, R4 from lines 33 into AND gate 213, and either K1, K2, K4 or K8 from lines 75-1 to 75-8 into AND gate 214; this serves to place the keyboard to external data on the CKB lines 55, when the instruction word is 00001XXX. The gating arrangements 210 function in setting and resetting bits in the RAM 25, and receive $\overline{R0}$, $\overline{R1}$, R2 and R3 from lines 33 into AND gate 216, so this part will be responsive to an instruction word 0011XXXX, while the remaining parts of the gates 210 are responsive to two of the R6, $\overline{R6}$, R7 or $\overline{R7}$ lines via OR gates 217 so that only one of the four gates 56-1 to 56-8 will produce a CKB output. This serves to select one of the four bits for a bit operation. The gating arrangements 212 include an AND gate 218 in each case, responsive to $\overline{R2}$, $\overline{R3}$, $\overline{R4}$ from lines 33. The output of gate 218 is OR'ed with R1 in gate 219, which in turn is connected to AND gate 220 along with $\overline{R0}$ and either R4, R5, R6 or R7. Thus, complex gates 212 serve to place all four bits R4, R5, R6 and R7 on the CKB outputs 55 when the instruction code is 01XXXXXX and any one or more of R2, R3 or R4 is a 0. For some constant operations, R4 or the first bit in the constant field is always a 1 — this is a necessary limitation on the constants which may be employed in this case. R1 is actually a "don't care" bit, if R2-R4 are 0, in that code of 00000XXX also applies the constant field R4-R7 to the CKB lines 55.

Figure 12A:
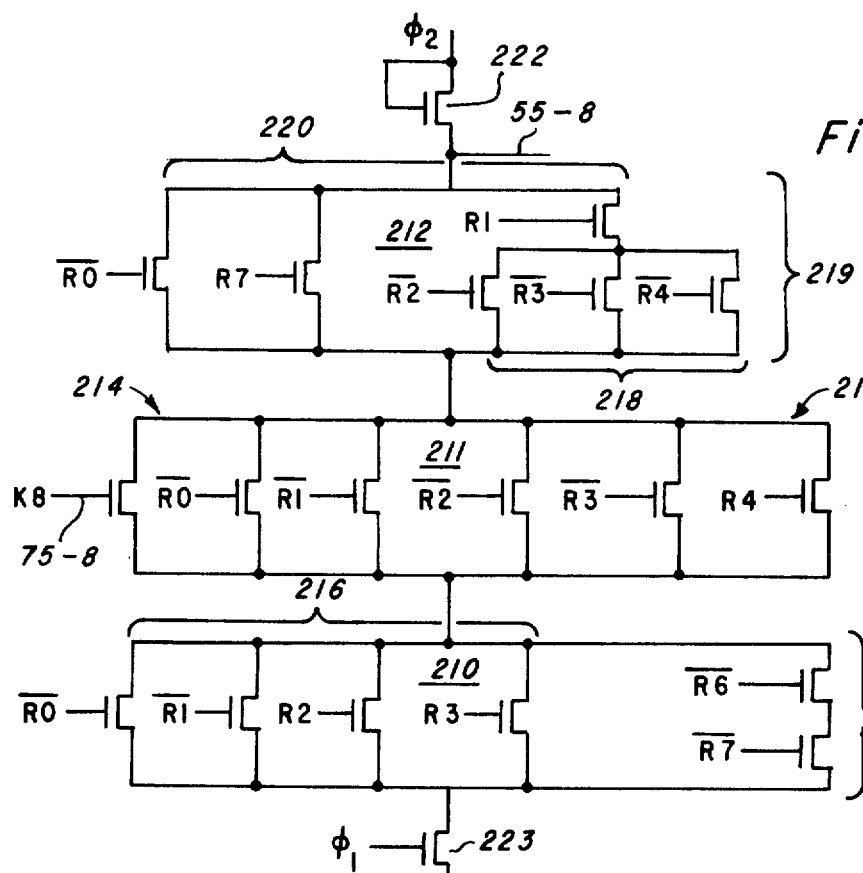
FIG. 12a is a detailed electrical diagram of one of the complex gates 56-8 of FIG. 12.

Referring to FIG. 12a, one of the complex gates 56 is shown, this being gate 56-8. The other gates 56-1, 56-2, 56-4 would be the same except for changes in the R6, R7 and K inputs as shown in FIG. 12. On $\phi 2$, the output line 55-8 is precharged to -Vdd through device 222, then during $\phi 1$ of the next cycle the output line 55-8 is conditionally discharged via the gate arrangements 210, 211 and 212, and device 223. It is seen that if the instruction code on lines 33 is 0011XXXX, gate 210 will be controlling because gate 212 will be shorted by R1 and $\overline{R2}$, $\overline{R3}$ while gate 211 will be shorted by $\overline{R2}$ and $\overline{R3}$. Thus, for 0011XXXX, one of the four CKB gates 56 will be selected by gates 217 which receive combinations of R6, $\overline{R6}$, R7, $\overline{R7}$. If the instruction on lines 33 is 00001XXX, gate 211 will be controlling because gate 210 is shorted by R2, R3, while gate 212 is shorted by R1, $\overline{R4}$, so that K8 will determine whether line 55-8 is shorted to ground. If the instruction on lines 33 is 01XXXXXX, the gate 212 is controlling because gates 210 and 211 are shorted by $\overline{R1}$, so R7 (or R4, R5 or R6 in the other gates 56) will determine discharge of line 55-8. Gate 212 also controls if the code is 00000XXX, because gate 210 is shorted by R2, R3 and gate 211 is shorted by R4, while gate 219 is not conducting because $\overline{R2}$, $\overline{R3}$ and $\overline{R4}$ are all "1's".

The overall function of the CKB logic 56 is thus seen to be threefold. First, a constant appearing in a field of the instruction code may be applied to the lines 55. Second, the keyboard or external inputs on lines 75 may be applied to the lines 55. Third, one of the four lines 55 may be selected, as for addressing one of 4 bits of a digit in the RAM 25. All of these functions are under control of the current instruction word.

THE RAM PAGE ADDRESS

Figure 13:
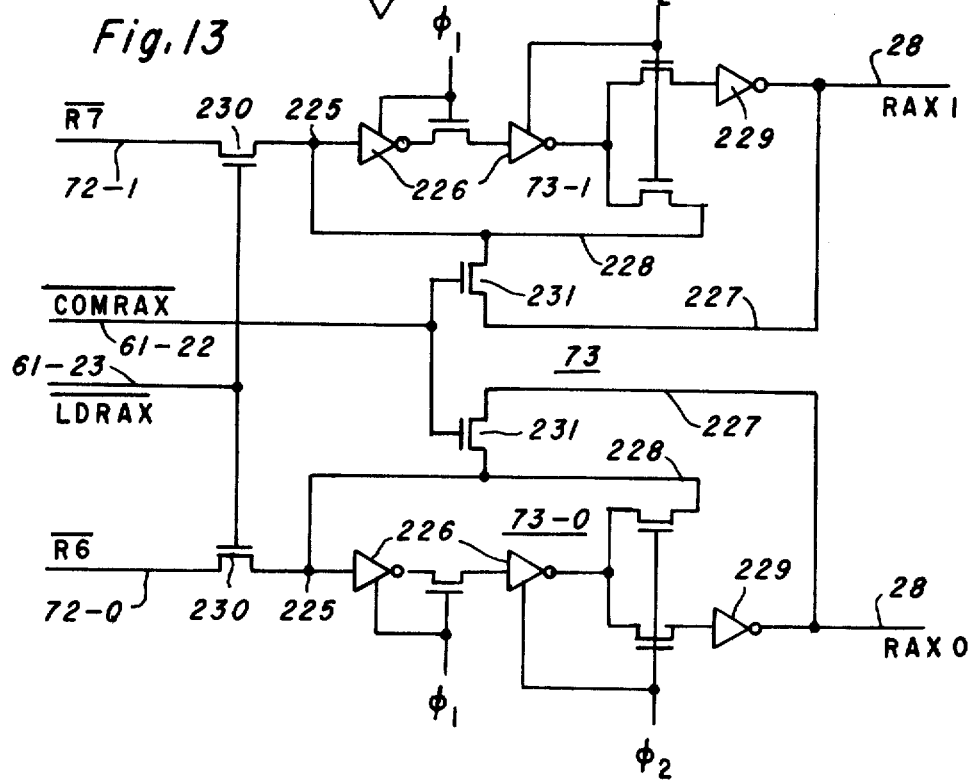
FIG. 13 is a detailed logic diagram of the RAM page address register 73 of FIG. 3.

In FIG. 13, the RAM page address register 73 is shown. The RAM page address consists of two bits, RAX0 and RAX1, which appear on lines 28. The register consists of two identical stages 73-0 and 73-1, each of which has an input 225, two inverters 226, and two separate feedback paths 227 and 228. Each stage is thus a recirculating register, clocked on $\phi 1$ and $\phi 2$. A 2-bit RAM page address may be loaded into the inputs 225, if devices 230 are turned on by a $\overline{LDRAX}$ or "load RAM X" command on line 61-23 from the control PLA 60. The address, once loaded, will recirculate indefinately via path 228. The RAM X address in the register is complemented when devices 231 are turned on by $\overline{COMRAX}$ command on line 61-22 from the control PLA 60 if it is a 0 or -Vdd. This causes recirculation via paths 227, and the address will be complemented. When $\overline{COMRAX}$ is a 1, the bits will recirculate via paths 228, and the address will remain the same.

The RAM page address is contained in the two-bit X register 73 which is used to directly address the RAM page decoder 29 via lines 28. The register 73 may be modified in two ways. First, $\overline{R6}$ and $\overline{R7}$, from the ROM 24 as part of the instruction word can be loaded, as described. Second, the address stored in the register 73 can be complemented bit for bit. No other mechanism including power-up clear and hardware clear have any affect on the X register 73. Modifications that do occur in the register 73 are not valid until the next instruction cycle.

THE ROM AND ROM PAGE ADDRESS DECODER

Figure 14:
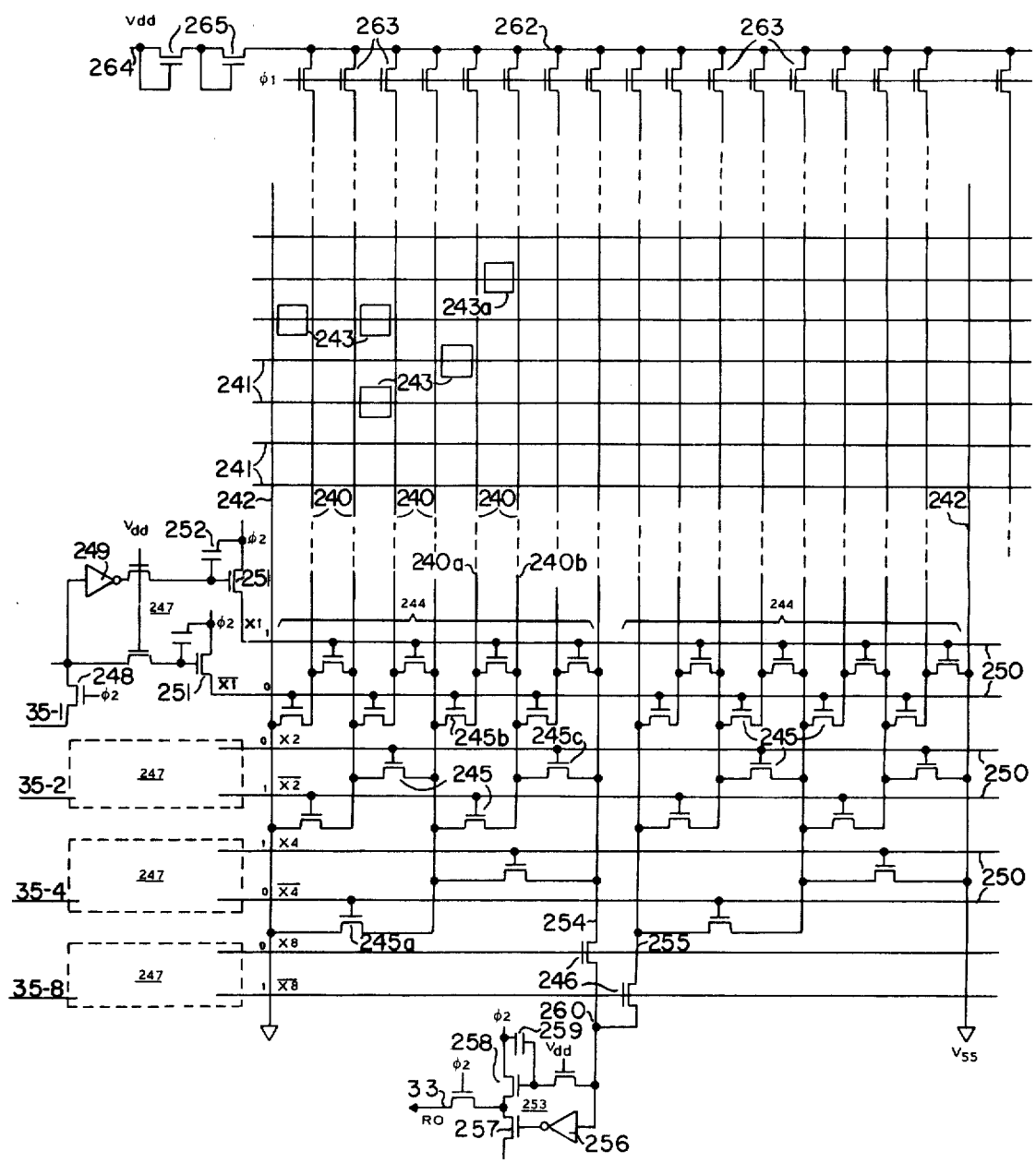
FIG. 14 is a detailed electrical diagram of the ROM 24 and the ROM page decoder of FIG. 3.

Referring to FIG. 14, the ROM 24 and the ROM page decoder are shown. The ROM consists of an array of X lines 240 which are elongated P-diffusions in the semiconductor substrate, and Y lines 241 which are metal strips over a field oxide coating on the substrate, made in conventional manner. 64 of the Y lines are provided in the array, although only a few are seen in FIG. 14, and 128 X lines. The ROM is of the virtual ground type, and so only one ground line 242 is needed for each eight X lines 240; interior ground lines are shared with adjacent groups, so actually only nine ground lines are needed rather than sixteen. Virtual ground ROM's are disclosed in copending U.S. patent applications Ser. No. 396,901, filed Sept. 13, 1973, and Ser. No. 400,471, filed Sept. 24, 1973, assigned to Texas Instruments. A data bit is formed between adjacent ones of the lines 240, or between a line 240 and a ground line 242, by means of thin oxide areas 243 as set forth in U.S. Pat. No. 3,541,543, assigned to Texas Instruments. A pattern of the thin oxide areas 243 define the 1 or 0 stored for each data bit, as they will each define the presence or absence of an MOS transistor. The ROM contains 8192 data bit locations or potential locations for the thin oxide areas 243. The locations are organized as 1024 words containing eight bits each. The eight bits exit from the ROM on eight lines 33 (only one of which is shown in FIG. 14)

which correspond to bits R0 to R7 of the instruction word. The 1024 words are divided into sixteen groups or pages of 64 words each.

The page decoder consists of sixteen arrays 244 of transistors 245. Only two arrays 244 are shown, but there are sixteen exactly alike. Each array contains only fourteen transistors 245, and one transistor 246, which is a great improvement over decoders for prior virtual ground ROM's. The decoder receives the four bit ROM page address on four lines 35-1 to 35-8, from the ROm page address register 46 of FIG. 10. Four input/precharge circuits 247, all alike, receive the ROM page address bits clocked in on $\phi 2$ by devices 248. Inverters 249 provide for true and complement, so eitht address lines 250 run the entire width of the ROM, through all sixteen of the arrays 244. These lines 250 provide X1, $\overline{X1}$, X2, $\overline{X2}$, X4 and $\overline{X4}$ inputs to the gates of transistors 245, and X8 and $\overline{X8}$ inputs to the gates of transistors 246. The selected lines 250 are charged on $\phi 2$ via devices 251, with bootstrapping by gated capacitors 252. An output circuit 253 connects each of the pairs of arrays 244 to one of the lines 33, so there are eight of the circuits 253, all alike. Adjacent arrays each have output lines 254 and 255, which are also X lines 240 in the ROM array; the X8, $\overline{X8}$ address bit selects only one of these output lines via transistors 246. The one selected is connected to the input of an inverter 256, to ground the output line 33 via device 257 if the selected one of the lines 254, 255 is at Vss when $\phi 2$ occurs, or to connect the output line 33 to -Vdd (through $\phi 2$) via device 258 if the selected one of the lines 254, 255 is at -V when $\phi 2$ occurs. A gated capacitor 259 serves to bootstrap the output to a high level. The page address selects one of eight lines 240 in each group of eight by the transistors 245 in each array 244; the 1, 2 and 4 bits, i.e., X1, $\overline{X1}$, X2, $\overline{X2}$, X4, $\overline{X4}$ lines are actuated in a pattern which connects one X line 240 to ground line 242 and the next adjacent X line 240 to line 254 or 255. For example, a ROM page address of 1010 (listed X1, X2, X4, X8) connects line 240a to ground line 242 via devices 245a and 245b, and connects line 240b to output line 254 via device 245c, while the device 246 on the X8 line connects line 254 to the node 260 and thus to the output. Any thin oxide gate 243a between lines 240a and 240b will thus be determinative, for the particular Y line 241 selected by the Y decode 27 to be later described.

An important feature of the ROm is the manner of precharging the lines 240. All of these lines 240 are connected to a common line 262 by devices 263 which are clocked on $\phi 1$. The common line 262 is connected to the -Vdd supply 264 by two depletion mode MOS transistors 265, so that the line 262 charges to -(Vdd - 2Vt), where Vt is a threshold voltage for the devices 265. Typically, Vdd is 15.0 volts and Vt is 2.0 volts. So, the lines 240 charge toward a lower voltage, meaning that the lines will be precharged fast and will discharge fast, compared to the performance if the lines are precharged to Vdd.

THE ROM/RAM WORD DECODER

Figure 15:
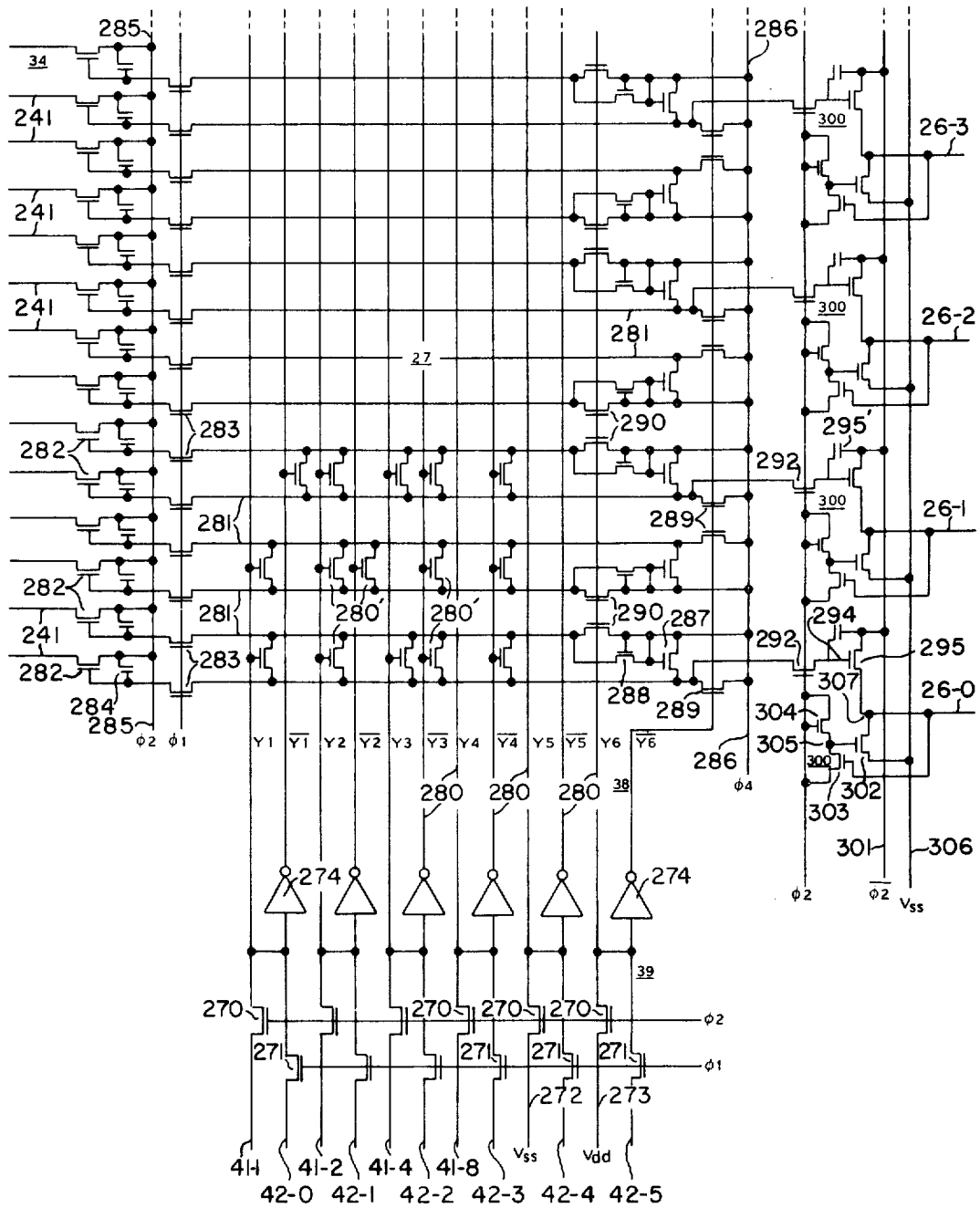
FIG. 15 is a detailed electrical diagram of the ROM/RAM word address decoder 27 and the data select 39 of FIG. 3.

Referring to FIG. 15, the word decoder 27 for the ROM 24 and RAM 25 is shown in detail, along with the data select circuit 39. The decoder 27 receives a twelve line address (6 bits and their complements) on lines 38, and selects one of 64 output lines 34 for the ROM or one of sixteen lines 26 for the RAM. The lines 34 are the metal stripes or Y lines 241 in the ROM. The select circuit 39 receives a four-bit RAM Y address on four lines 41-1 to 41-8 from the RAM Y register 40, gated in on $\phi 2$ by devices 270. The circuit also receives the 6-bit program counter output 42 on lines 42-0 to 42-5, gated in on $\phi 1$ by devices 271. During every machine cycle, a ROM address is delivered on $\phi 1$ and a RAM address on $\phi 2$. Since the RAM Y address is only four bits ($2^4 = 16$), while the ROM address is 6 bits ($2^6 = 64$), the extra bits are connected to Vss and Vdd at points 272 and 273, respectively, for the RAM address. With inverters 274, trues and complements are provided to the decoder on twelve lines 280 (same as lines 38), these being labelled Y1, $\overline{Y1}$ ... Y6, $\overline{Y6}$. The lines 280 are metal strips, overlying P-diffused lines 281, to form an array similar to a ROM. Thin oxide areas are provided in selected bit positions under the lines 280 to create MOS transistors 280' between adjacent ones of the lines 281. A given six-bit code selects one of the lines 281. All of the lines 281 are connected to the gates of devices 282 on $\phi 1$ via devices 283. Gated capacitors 284 serve to bootstrap the gate voltage on 282 to a higher level. The lines 241 are all at ground until one is driven negative during $\phi 2$ from line 285, due to one of the transistors 282 having had its gate driven negative during $\phi 1$. The lines 281 are charged by $\phi 4$ twice during each machine cycle. $\phi 4$ is applied to lines 281 from line 286 via devices 287 and 288. During the first part of $\phi 1$, all of the lines 281 and gates of devices 282 charge negative from $\phi 4$, then during the last half of $\phi 1$, $\phi 4$ goes to ground and all but one of the lines 281 and gates of devices 282 discharge back to ground, depending on the pattern of thin oxide areas connecting lines 281 together and depending on which ones of the lines 280 are negative. Devices 289 and 290 select alternate paths for discharging of the lines 281. These devices 289 and 290 are gated by Y6 and $\overline{Y6}$, so one will always be on and the other off, during $\phi 1$ and $\phi 2$. The lines 281 also charge negative from $\phi 4$ during interval 95, the first half of $\phi 2$, then during the last half of $\phi 2$ all but one discharges to ground into the $\phi 4$ source.

The output from the decoder 27 to the lines 26 occurs on $\phi 2$, via devices 292, through which 16 of the 64 lines 281 are connected to gates 294 of devices 295 in address output circuits 300, of which there are sixteen identical circuits — only four are shown. The selected RAM address line 26 is driven to -V during $\overline{\phi 2}$ from line 301, by device 295. Bootstrap-gated capacitor 295' assures a high negative level on selected line 26. The unselected lines 26 are held at ground by a zero-keeping circuit including devices 302, 303 and 304. During $\phi 2$, while gate 294 is being charged for the one selected output, the device 304 conducts and drives the gate 305 negative, turning on transistor 302 and thus connecting all the lines 26 to Vss line 306. Then, when $\phi 2$ goes to ground, and $\overline{\phi 2}$ goes negative, node 307 of the selected address line 26 starts negative, turning on device 303 annd discharging node 305, thus disconnecting the selected address line from ground. The unselected address lines will stay at ground because node 305 will remain negative, keeping device 302 on. The effect of this output circuitry 300 is that lines 26 will all be at ground during $\phi 2$, and during $\overline{\phi 2}$ they will all be at ground except the selected one which will be at -Vdd.

THE D OUTPUT REGISTER

Figure 16:
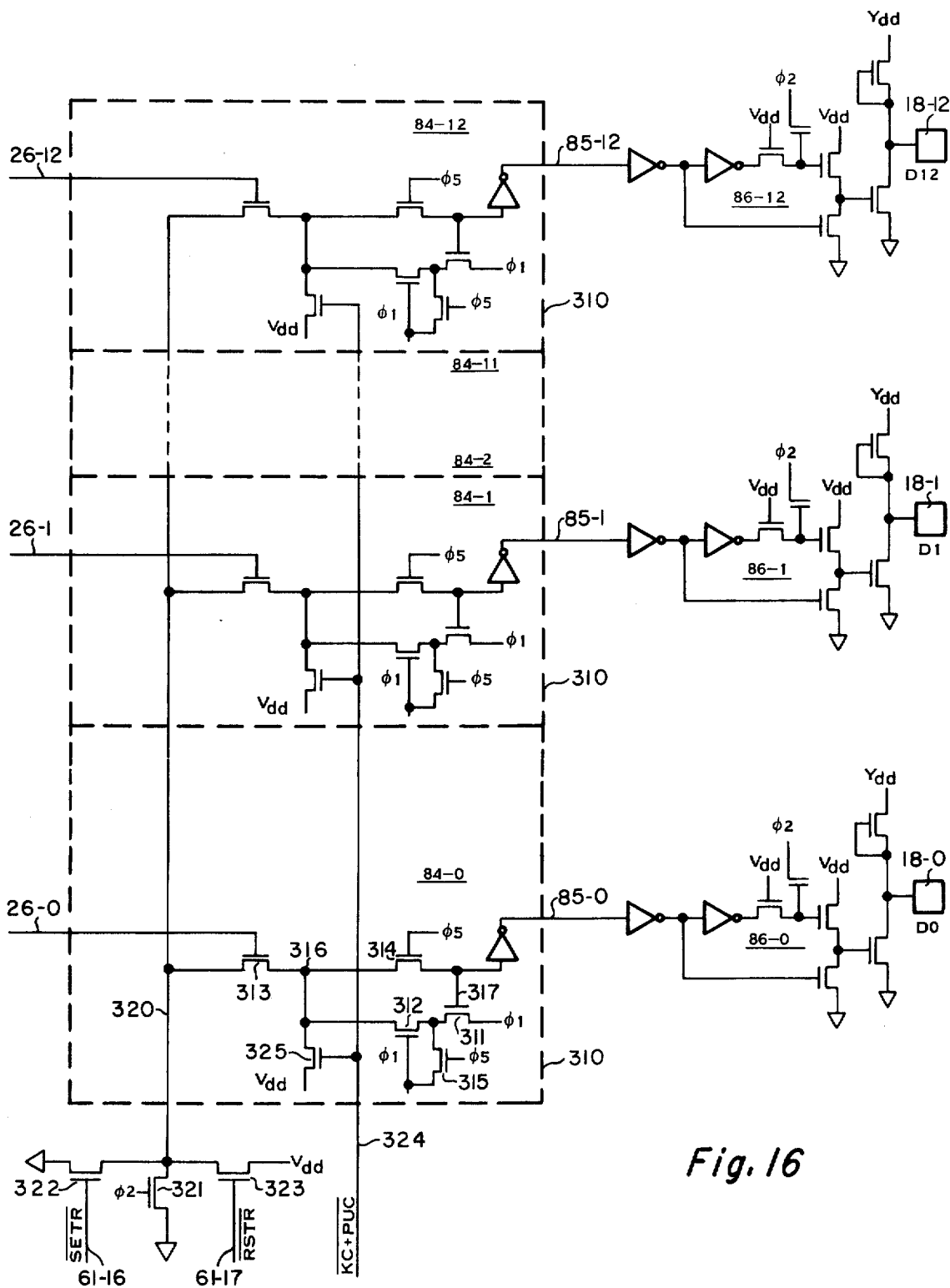
FIG. 16 is a detailed electrical diagram of the output register 84 and output buffers 86 of FIG. 3.

Turning now to FIG. 16, the output register 84 and output buffers 86 are shown in detail. This register consists of thirteen identical stages 310, only three being illustrated. Each stage 310 is a self-refreshing RAM cell generally the same as used in the RAM 25, but with added controls. The cell includes five transistors 311, 312, 313, 314 and 315. The capacitance of node 316 and the capacitance of the gate 317 of transistor 311 are important. If a negative voltage is stored at node 316, it will charge gate 317 during $\phi 5$ via device 314. Then during $\phi 1$, the negative voltage on gate 317 turns device 311 on, and device 312 will be on, so node 316 will charge more negative, refreshing the stored charge. If the node 316 is at Vss, gate 317 will not be charged during $\phi 5$, device 311 will not turn on during $\phi 1$, so node 316 will remain at Vss. Input to the node 316 is via device 313 which is turned on or off by one of the address lines 26. All of the devices 313 of the thirteen cells 310 are connected to a line 320, which is grounded during $\phi 2$ by device 321. Lines 61-16 and 61-17 receive $\overline{SETR}$ and $\overline{RSTR}$ commands from control PLA 60, which connect the line 320 to ground or Vdd, respectively, via devices 322 and 323. The nodes 315 are forced to -Vdd upon power-up-clear or by the clear key via command line 324 upon which $\overline{KC + PUC}$ is applied from clear circuit 82. A negative voltage on line 324 turns on device 325, applying a 0 or -Vdd to node 316. All of the cells 310 will remain in this 0 state until a $\overline{SETR}$ command occurs and one of the lines 26 goes to -V, which occurs during $\overline{\phi 2}$. Only one of the cells 310 can be set during one instruction cycle because only one RAM Y address line 26 goes negative. Once set to 1 or Vss, a cell will remain in that condition until specifically addressed and reset by actuating $\overline{RSTR}$ command and addressing the cell by a line 26. The stages 84-0 to 84-12 can be set and reset in any order, and several or all can be in the set condition at the same time. For example, if it is desired to test for "any key down", all of the outputs 18 may be actuated by setting all of the stages 84 (requiring one instruction cycle for each stage) then the K lines would be read in and tested. Also, leading zero suppression may be implemented by various routines because all D outputs need not be actuated, and they may be actuated MSD to LSD, or LSD to MSD.

The output buffers 86 function to provide either Vdd or ground potential to the terminals 18, according to the bits stored in the various stages of the register 84. The circuitry shown is adapted to assure full voltage swing.

THE ACCUMULATOR OUTPUT REGISTER AND SEGMENT DECODER

Figure 17:
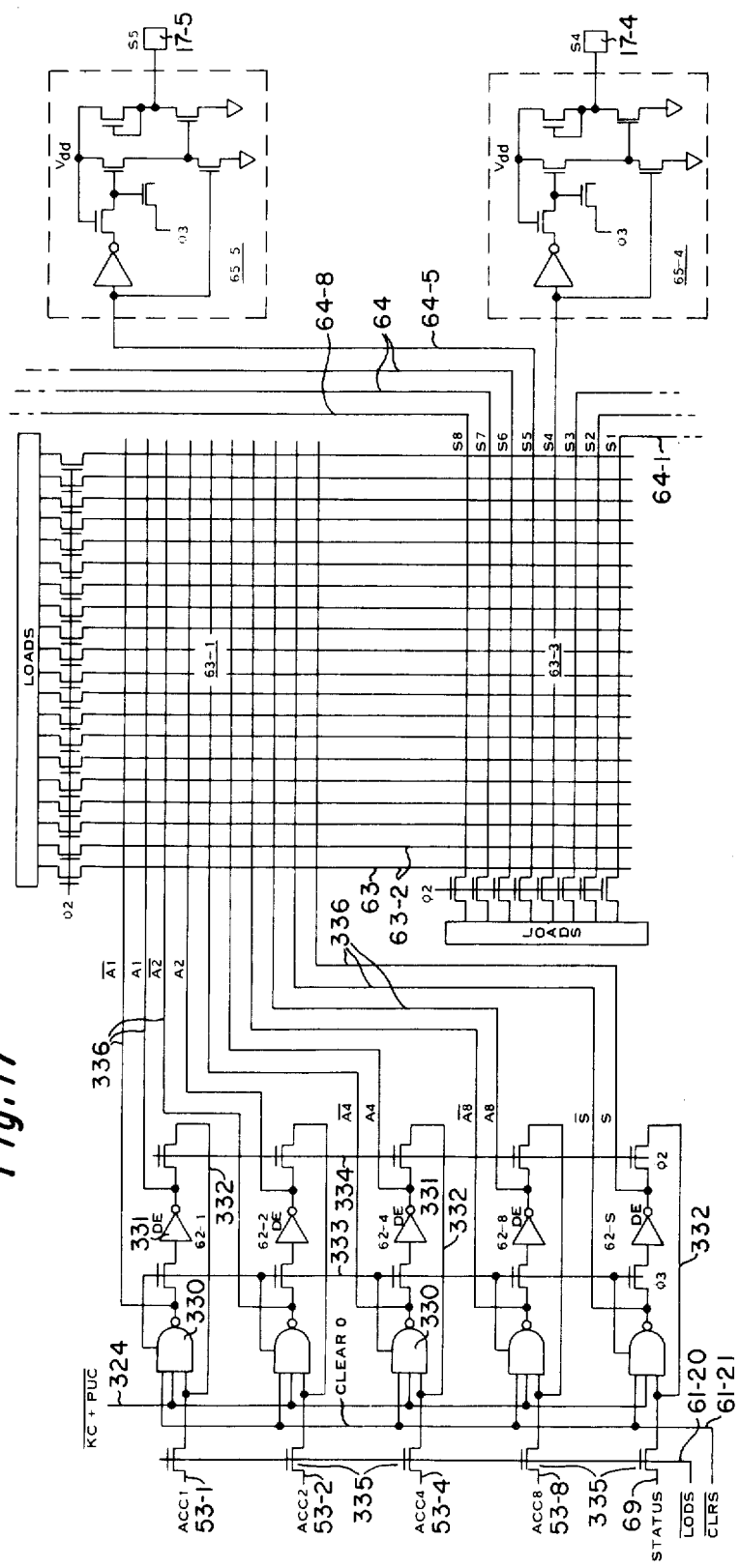
FIG. 17 is a detailed electrical diagram of the output register 62 and the output buffers 65 of FIG. 3.

In FIG. 17, the accumulator and status output register 62 is shown in detail along with the segment decoder PLA 63 and the output buffers 65. The register 62 consists of five identical recirculating register stages 62-1, etc., each of which includes a NAND gate 330, an inverter 331, and a recirculate path 332. The stages are clocked at $\phi 3$ and $\phi 2$ by lines 333 and 334. Input data is applied to stages 62-1 to 62-8 from the accumulator output lines ACC1 to ACC8 (53-1 to 53-8) from FIG. 6. Input data is applied to the status buffer 62-5 from the status latch output line 69 of FIG. 8. These inputs are loaded via devices 335 upon the occurrence of a $\overline{LODS}$ command on line 61-20 from the control PLA 60. All of the stages of the register 62 may be cleared by a $\overline{CLRS}$ command on line 61-21 from the control PLA 60, which is an input to all of the gates 330. Also, the stages of the register 62 are cleared, that is zeros are loaded, by a $\overline{KC + PUC}$ command on line 324. True and complement outputs from the states 62-1 to 62-5 are applied by A1, $\overline{A1}$, A2, $\overline{A2}$...S, $\overline{S}$ lines 336 to ten inputs to the first section 63-1 of the PLA 63, which causes one of twenty lines 63-2 to be actuated in the usual manner of coding PLA's. The second section 65-3 of the PLA is coded to actuate one or more of the lines 64 for inputs on the lines 63-2. The PLA 63 may be coded to convert the BCD information on the accumulator output to standard 7-segment display drive signals for typical calculator operation, or BCD may be sent out on four of the lines 64, or any other desired code. Decimal point placement may be by the status latch output on S8.

The eight output buffers 65-1 to 65-8 are all alike — only two are shown in FIG. 17. These buffers function to apply Vss or -Vdd to the output terminals 17 for driving the segments of the display or other output such as data lines or a printer.

THE POWER-UP-CLEAR CIRCUIT

Figure 18:
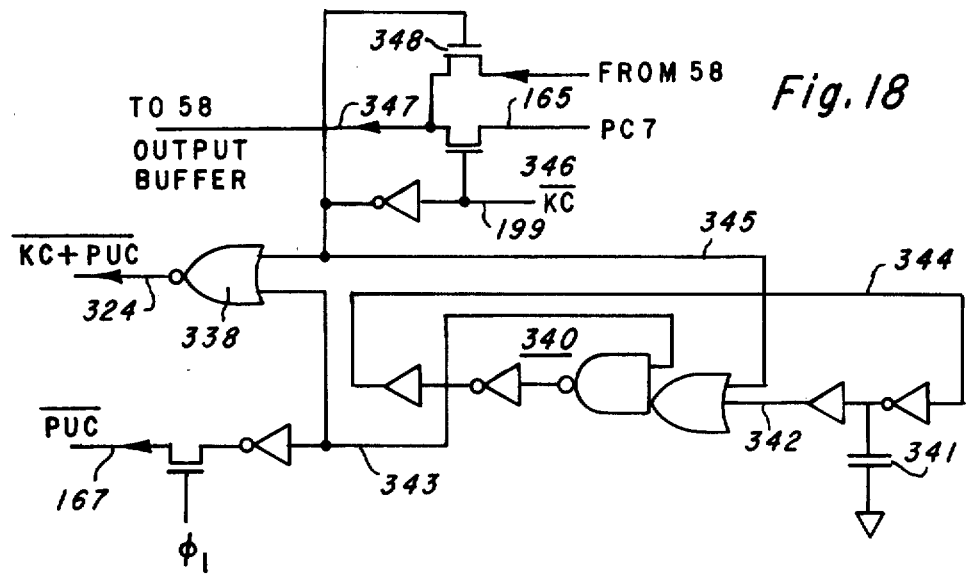
FIG. 18 is a detailed logic diagram of the power up clear circuit 82 of FIG. 3.

In FIG. 18, a circuit is shown for generating power-up-clear command $\overline{PUC}$ on line 167 of FIGS. 9 and 10, and generating the "hardware clear or power-up-clear" command $\overline{KC + PUC}$ on line 324 of FIG. 17. An OR gate 338 receives the clear key signal from $\overline{KC}$ on line 199 and an inverter. $\overline{PUC}$ is generated by a latch 340 and a capacitor 341. When power is first turned on, the capacitor 341 is not yet charged, and the input 342 is essentially at ground, so latch 340 is in one state, producing an output via line 343 to produce $\overline{PUC}$ on line 167 and $\overline{KC + PUC}$ on line 324. After the capacitor has charged, the latch 340 flips, and $\overline{PUC}$ goes back to ground so the calculator can operate in its usual mode. Feedback loop 344 assures that the capacitor discharges, or that the latch 340 is in the proper state, when power comes on. If an external capacitor is used, $\overline{KC}$ inverted, on line 345, serves to stretch $\overline{PUC}$. The remainder of the circuitry is for testing the chip. The output 165 of the last stage 36-0 of the program counter 36 is connected to the device 346, which is turned on by $\overline{KC}$ on line 199. The output of the device 346 is connected by line 347 to the input of the S8 output buffer 65-8. So, when $\overline{KC}$ is negative, the contents of the program counter 36 can be read out serially on a terminal 17-8, via buffer 65-8. When $\overline{KC}$ is at ground, device 348 is turned on, and line 64-8 is connected to the S8 output buffer for the usual operating mode.

THE PROGRAM COUNTER FEEDBACK

Figure 19:
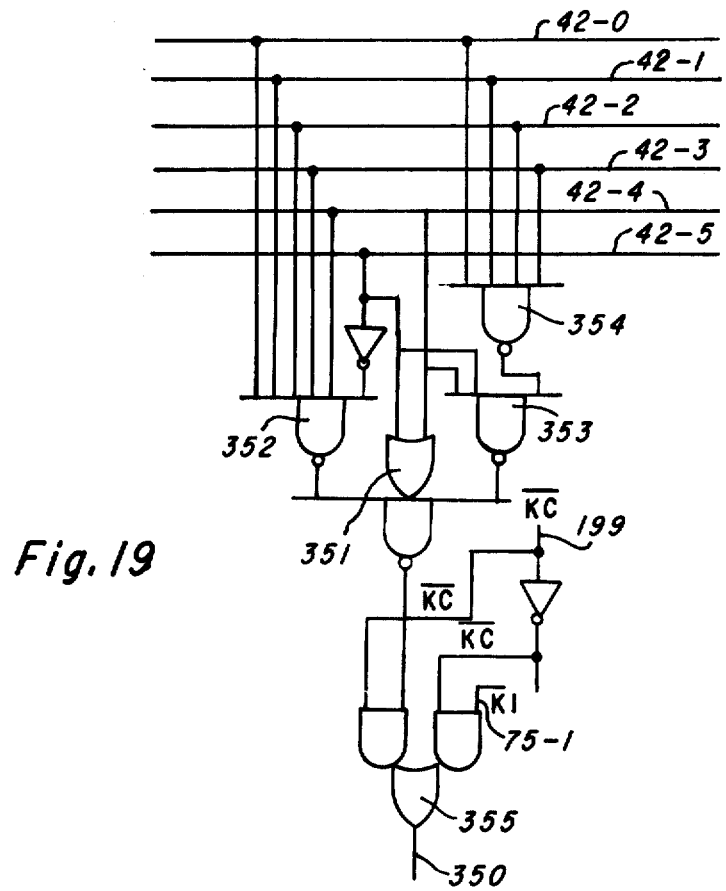
FIG. 19 is a detailed logic diagram of the feedback circuit for the program counter 36 of FIG. 3.

Referring to FIG. 19, a feedback circuit for the program counter of FIG. 9 is illustrated. This logic arrangement examines the six individual outputs 42-0 to 42-5 of the program counter 36 and determines whether a 1 or 0 is to be fed into the first stage of the program counter via line 350. An exclusive OR circuit 351 examines lines 42-4 and 42-5 which are the outputs of the last two stages of the counter 36, and generates an equivalence; if both are 0 or both 1, a 1 is fed back to input 350, and if they are different, then a 0 is fed back. This permits a count up to 63 in a random manner, but some means must be provided to break out of a situation of all ones in the shift register 36. With all ones, the term fed back would be 1, and the counter would remain at all ones. To avoid this, the gate 352 is responsive to $\overline{012345}$ and forces a count of 111111, where the counter would be stuck, but AND gates 353 and 354 are together responsive to 012345, forcing a 0 as the next feedback. This arrangement causes the six stage shift register to count to 64 in a psuedo-random manner, ie., in a set repetitive order but not in regular order. The gating arrangement 355 is for testing; when $\overline{KC}$ appears on line from FIG. 11, the usual path from gate 351 is broken, and the K1 input on line 75-1 is fed serially into the program counter input 350.

THE CLOCK GENERATOR

Figure 20:
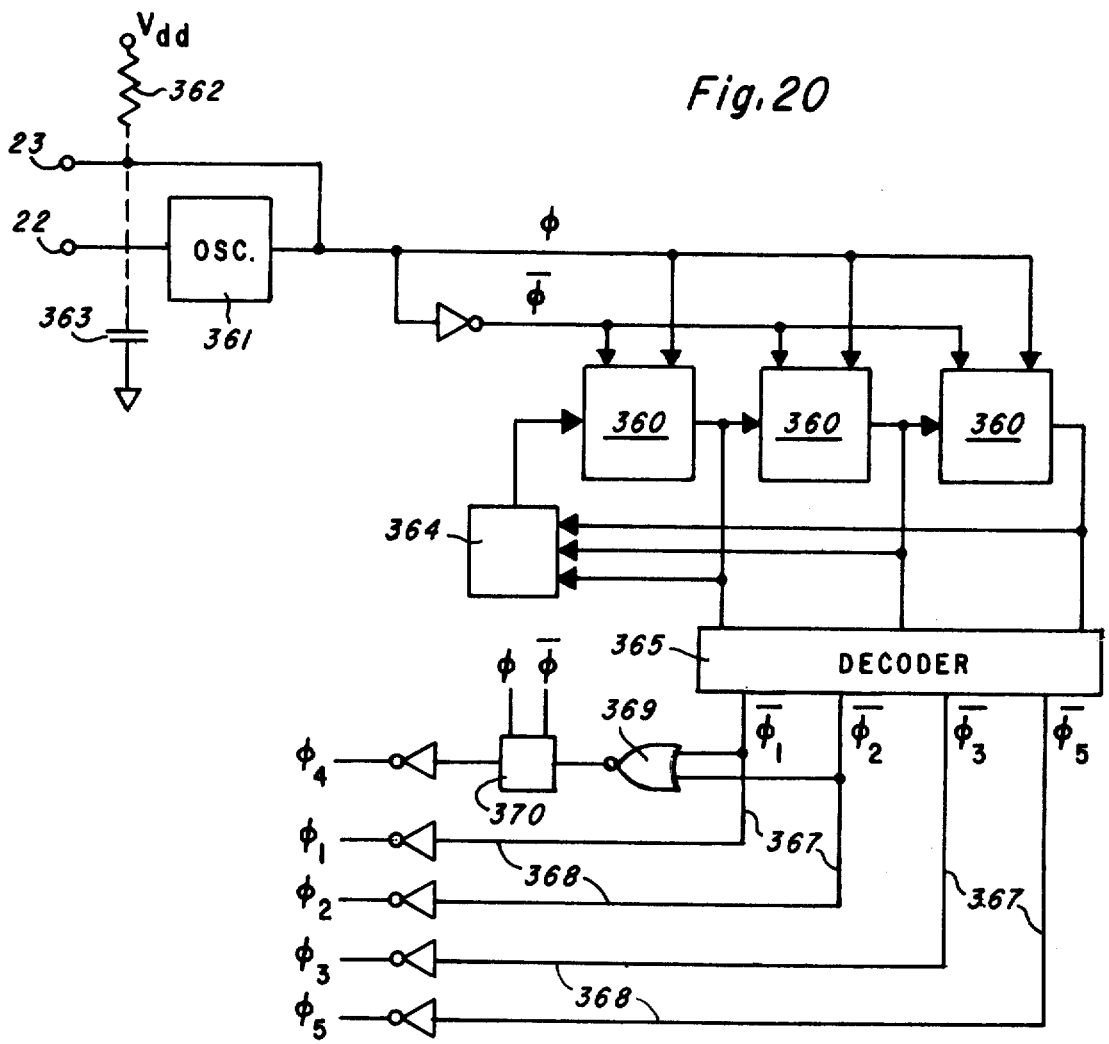
FIG. 20 is a block diagram of the clock generator 80 of FIG. 3.

Referring to FIG. 20, a block diagram of the clock generator 80 is illustrated. The clock generator consists of three conventional counter stages 360, each of which is clocked by $\phi$ and $\bar{\phi}$ which are obtained from a clock oscillator 361. The clock $\phi$, at a frequency of about 500 KHz, may be synched directly from the external pin 22, or the external pins 22 and 23 may be tied together and to -Vdd through a resistor 362 which sets the frequency. The frequency may be set more precisely by using a smaller resistor and a capacitor 363 connected to Vss. In any event, the oscillator 361 may be of various forms. To generate the six intervals 91-96 of FIG. 4, from the clock $\phi$, counter stages are connected to count to six in conventional manner, using a feedback circuit 364. A decoder 365 selects from the three outputs 366 from the counter, representing the six distinct states of the counter, to produce $\bar{\phi}1$, $\bar{\phi}2$, $\bar{\phi}3$ and $\bar{\phi}5$ on output lines 367, and these are inverted to produce $\phi1$, $\phi2$, $\phi3$ and $\phi5$ on outputs 388, to be used throughout the system. To generate $\phi4$, the outputs 367 for $\bar{\phi}1$ and $\bar{\phi}2$ are connected to an OR gate 369, the output of which is delayed one interval by one counter stage 370, producing $\bar{\phi}4$. The inverted $\bar{\phi}4$ output provides $\phi4$ on line 371.

DETAILS OF LOGIC BLOCKS

In FIG. 21a to 21j, the logic gates, inverters, etc. which are used in the system of FIGS. 3 and 5-20 are shown in detail. Note that all of the inverters are of the ion implanted depletion load type, which minimizes power consumption. The gates use either depletion loads, or gated loads, or are of the precharge type, again for power savings.

THE INSTRUCTION SET

The 8-bit instruction words contained in the ROM 24 and read out onto the lines 33 are of the format shown in FIG. 22, where block 380 represents a word containing eight bits R0 to R7. This word may be considered as having certain fields and subfields, which are different for various functions. The R0 bit always distinguishes between branch or call (logic 1) and operation (logic 0); this is the OP1 field. The instruction set has four basic formats I, II, III and IV, and the field OP1 appears in all. Format I is for branches or calls, and includes a field CB at R1 which distinguishes between the two, along with a field W at R2 to R7 which is a 6-bit address for the location of the branch or call. Format II is that of instructions involving constants of 4 bits contained in field C at R4 to R7; here the 3-bit OP2 field at R1 to R3 defines the operation performed with the constant. Format III is for bit and RAM page operation, where field B is the bit or address, field F defines the operation, and field OP3 is characteristic of the O11 code for bit or RAM page operations. Format IV is for arithmetic or special instructions defined by fields OP3 and A.

A Karnaugh map of the general classes of instructions is shown in FIG. 23. An 8-bit instruction word permits $2^8$ or 256 possible combinations or unique instructions. One fourth of these, the 64 in the upper left 11 quadrant, represent 64 possible CALL operations. Another one fourth, the 10 quadrant, represent 64 possible branch operations, i.e., each being a branch to one of 64 possible ROM locations. The lower left 01 quadrant contains 64 possibilities for constant operations, with each quadrant of this containing sixteen possible constants in the 4-bit constant field C. The 00 quadrant, lower right, contains 16 possible page addresses for long calls or long branches in the C field of the 0001 portion, and contains 16 "bit" and RAM page operations in the 0011 portion. All of the arithmetic and special instructions are contained in the 32 possibilities in the 0010 and 0000 parts.

A detailed description of one instruction set is set forth in the attached Table. Other instruction sets are possible by reprogramming the control PLA and the ROM. The one described in the Table is useful for calculator functions.

Note that the mnemonics for the various instructions in the instruction set are identical with most of the lines 147 and 61-61 to 61-23 of the control PLA of FIG. 7.

It will be noted that operation of the program counter 36 and the subroutine register 43 depends on the mode (or machine state) of the system. Two states are possible, the normal state and the CALL state which signifies entry into a subroutine. Machine state is determined by the status of the CALL latch 201 which is controlled by successful CALL or RETURN instructions.

At the beginning of each instruction cycle during which the machine is in the normal mode of operation, the word address present in the program counter 36 is updated via the circuit of FIG. 19 to generate the next ROM word address and this next ROM address is unconditionally stored in the subroutine register 43. Upon execution of a successful CALL instruction, the machine enters the CALL state preventing further data transfer into the subroutine register 43. The contents of the subroutine register 43 are not held at the word address of the CALL instruction, but instead at the word address of the next sequential instruction.

Executing a RETURN instruction will return the machine to the normal state and transfer the contents of the subroutine register 43 into the program counter 36, thereby returning to the proper word address.

The program counter 36 is not affected by the machine state or CLATCH. The program counter will generate the next word address every instruction cycle unless the contents are altered by the execution of a successful CALL, a successful BRANCH or a RETURN instruction.

The machine state will alter the function of the ROM page buffer register 47. During the normal mode, the register 47 serves as a source for new page information when executing a successful CALL or a BRANCH. A successful BRANCH when executed in the normal mode will always copy the contents of the register 47 into the ROM page address register 46. Therefore, unless the contents of the register 47 are modified, any and all subsequent successful branches will be within the same page. BRANCHES of this type are called short branches. To branch to a different page, a long branch, the contents of the register 47 must be modified to the desired page address by performing a load ROM page register instruction. Execution of a successful BRANCH will not copy the new page address into the address register 46, and set the hardware to perform short branches within the new page.

The data transfer from the buffer register 47 to the address register 46 operates in the same manner when executing a successful CALL instruction. Long CALLS can be executed by performing a load ROM page register instruction prior to the execution of a CALL instruction. Omitting the Load P-register instruction would result in a short call.

After executing either a long or short call, the contents of the address register 46 which contained the preCALL page address is copied into the buffer register 47. Data transfer between the buffer register 47 and address register 46 is inhibited. Thus, the buffer register is used to store the desired page address upon returning from a subroutine. Because of the above feature, it is not possible to perform long branches while the machine is in the CALL mode. Likewise, a subroutine cannot contain more than 64 instructions (one full page). It is permitted, however, to modify the contents of the buffer register 47 when in the CALL mode by executing a load ROM page register instruction. This would permit the modification of the return page address when exiting a subroutine. Execution of a RETURN instruction copies the buffer register 47 contents into the address register 46, sets the hardware to perform short branches and returns the machine to the normal state.

An unsuccessful CALL or BRANCH will have no effect on either the machine state or the contents of the registers 46 and 47. Any data present in either of the two page address registers will remain unchanged. That is, if a short CALL or BRANCH was to be performed, the hardware will be set to perform short operations; if a long CALL or BRANCH was initiated, the hardware will be set to perform the long operation. In addition, executing a RETURN in the normal mode is a no-op.

Supplementing the instruction control of the ROM addressing logic, an external input in addition to a powerup circuit are included for circuit initialization. Circuit initialization will set the machine state to normal, set the page addresses to perform short branches, set the page address contents to the complement of data applied on the four K lines, and serially copy the data present on the K1 line into the program counter 36.

With no external inputs applied, the program counter 36 will be set to hex word 00 (0) and the page address register 46 set to hex address F (15).

In regard to the instruction set, it will be noted that the adder 50 is capable of performing two separate, simultaneous functions and providing three outputs. The two, four-bit inputs 57 and 58 can be added and compared to each other providing a true binary sum output, a carry out of the MSD and a comparison indicating if the two binary numbers are equal in magnitude, that is, identical bit for bit. Compare and carry information can be used for setting up call or branching conditions. The sum provided can be stored in either or both the accumulator and RAM Y register or it may not be used at all.

INSTRUCTION WORD EXECUTION TIMING

Figure 24:
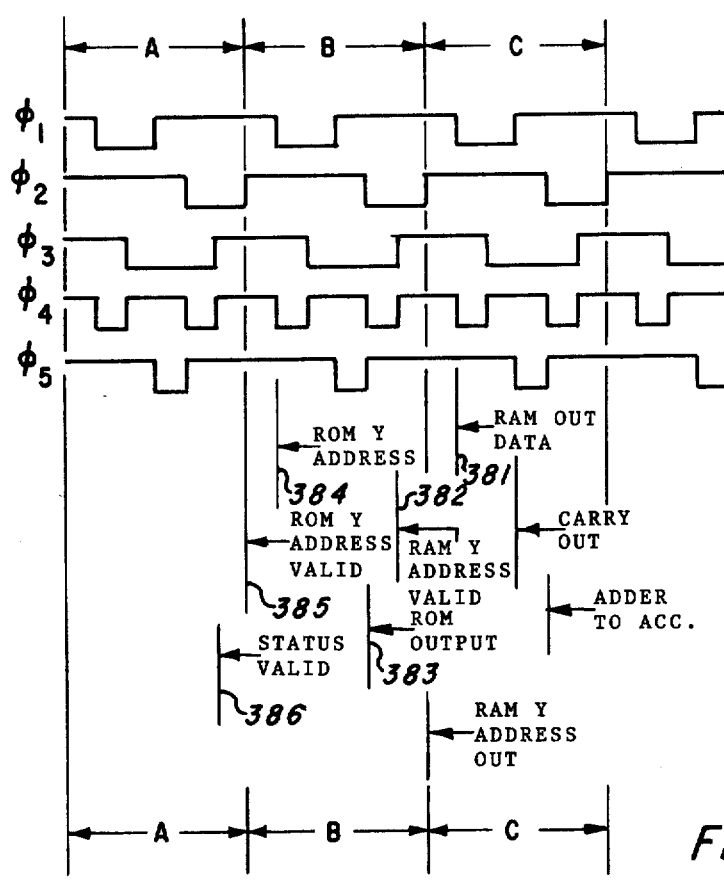
FIG. 24 is a timing diagram showing several instruction cycles in the operation of the system of FIGS. 1-21.
Figure 25:
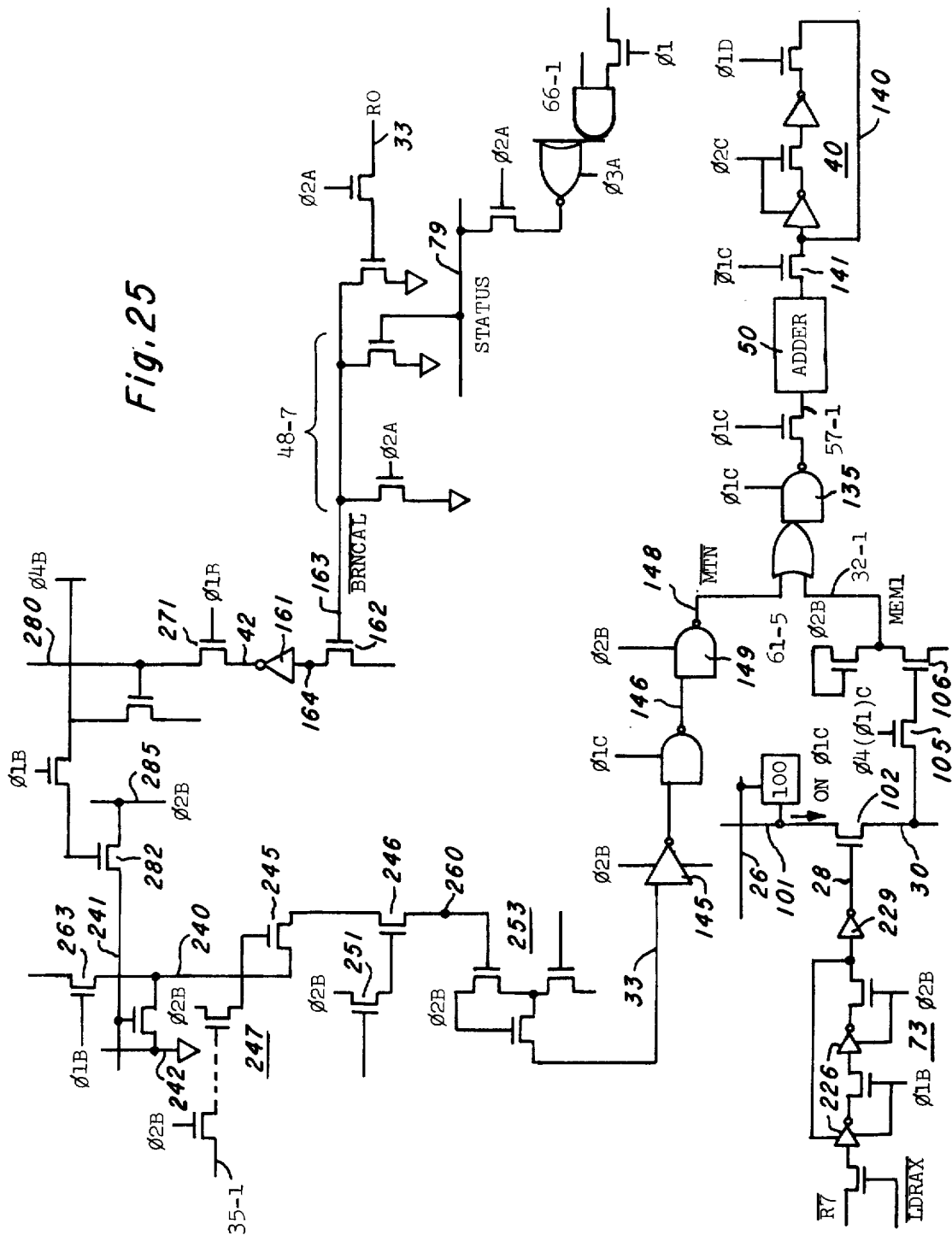
FIG. 25 is a schematic representation of timing of various events in the system of FIGS. 1-21.

The timing sequence of execution of instruction words may be understood by reference to FIGS. 24 and 25. In FIG. 24, a series of instruction cycles A, B, C., etc., are shown, with the system clocks $\phi 1$, $\phi 2$, $\phi 3$, $\phi 4$, $\phi 5$. Consider that in cycle C, the contents of a digit in the memory or RAM 25 are to be transferred to the adder 50 and output to the accumulator 52. A schematic representation of the operation is seen in FIG. 25. The adder 50 input is valid during $\phi 1$ of instruction cycle C, shown as $\phi 1C$. The bit from the RAM 25 comes valid at $\phi 4\phi 1C$ at device 106, the output line 32 having been precharged on $\phi 2B$ by device 107. The command $\overline{MTN}$ on line 61-5 becomes valid after $\phi 2B$ when devices 149 come on in the control PLA 60. The lines 146 of the control PLA are valid after $\phi 1$ C starts. The instruction word on lines 33 is valid during $\phi 2B$ coming out of the RO, at output circuit 253. The output decode for the ROM at devices 245 and 246 also is effective at $\phi 2B$, from devices 251, 248 and line 35-1. In the ROM, the lines 240 are precharged at $\phi 1B$, and contain valid data at $\phi 2B$. The Y lines 241 are valid at $\phi 2B$, the device 282 having been set up at $\phi 1B$. The line 281 in the Y decode 27 was precharged at $\phi 4(\phi 1)B$ and became valid at the last part of $\phi 1B$. The RO M $\phi 4(\phi 1)B$ and became valid at the last part of $\phi B$. The RO M Y address from the program counter was gated in by device 271 at $\phi 1B$. Assuming that the $\overline{MTN}$ operation was a result of a branch, then the $\overline{BRNCAL}$ command on line 163 became valid after the end of 02A, in gate 48-7. The RO branch command from lines 33 was gated in here on $\phi 2A$, and status was valid on line 79 during the last half of $\phi 2A$, after the precharge of gate 66-1 on $\phi 3A$ ended. Meanwhile, the branch address comes into the program counter from lines 33 which contained the branch address valid at $\phi 2A$ from output 253 of the ROM.

Thus, for an instruction as defined to be executed in cycle C, the data starts out at point 381 in FIG. 24, the RAM Y address for the data is valid at point 382, and the ROM instruction starts out on lines 33 at point 383. The ROM Y address for this word goes into the decoder 27 at point 384. This address became valid at point 385. Status became valid for a branch to this address at point 386, and the branch address was also valid at the ROM output at this point 386.

THE MOS/LSI CHIP

Figure 26:
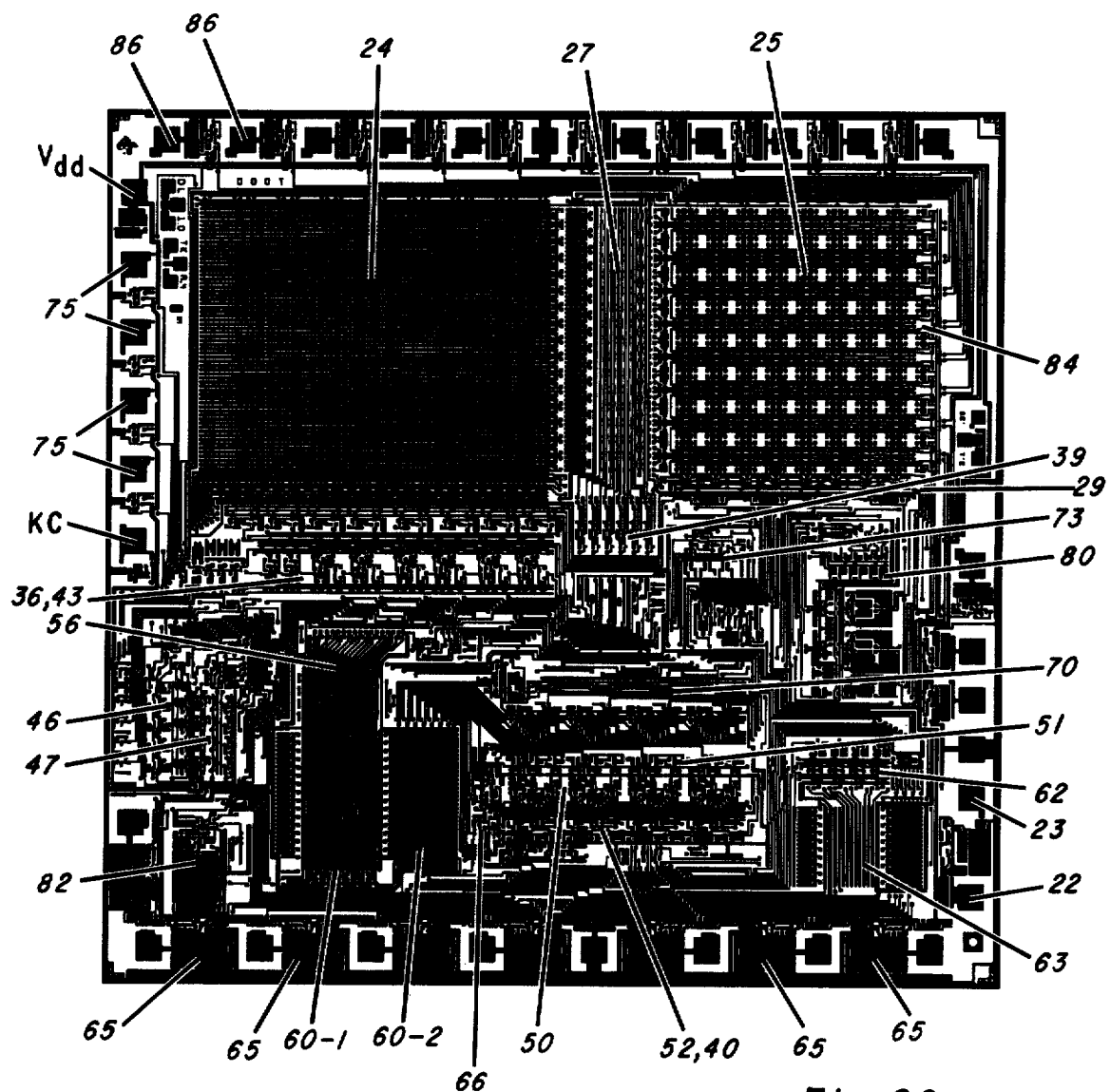
FIG. 26 is a top view, greatly enlarged, of an MOS/LSI semiconductor chip incorporating all of the circuitry of the system of FIGS. 3 and 5-21.

The entire system described above is fabricated in a single MOS/LIS chip as seen greatly enlarged in FIG. 26, wherein all of the major parts are labelled with the same reference numerals as used in the block diagram of FIG. 3. A P-channel metal gate process is used, with ion implant for depletion loads. The chip contains more than twenty-eight bonding pads, because it is possible to use it in a package of more than twenty-eight pins if more digits of display are to be used. Note that the ROM, RAM, and control PLA occupy the major part of the area of the chip. The chip is about 200 mils on a side.

THE CHIP TEST FUNCTIONS

The facility for operating the chip in a test mode has been referred to. This mode would ordinarily be used in manufacture, either before or after the chips are sealed in the typical twenty-eight pin plastic packages. The chips are made in batches of perhaps one hundred all at one time on a silicon slice of 3 inch diameter; may slices would be processed at the same time. After all of the processing steps are complete, the slice is scribed and broken into individual chips as seen in FIG. 26. The yield of good devices from this process is sometimes considerably less than 100%. Test must be made to find out which slices are good, which chips on a slice are good, then which final packaged devices are good, since there can be attrition at each process step. This testing could become very time consuming and expensive, because to be absolutely certain that every one of the 8800 transistors plus the associated connections are all perfect, all of the routines of the calculator would have to be implemented. For this reason, the testing mode has been included. The procedure would be to check each of the 1024 instruction words in the ROM, then exercise several instructions which are sufficient to check the remainder of the circuitry.

The operations available in the test mode are as follows:

First, a ROM word address may be serially loaded into the program counter 36 via the K1 pin 75-1, which goes into the gate 355 in FIG. 19 and thence into the program counter of FIG. 9 via line 350. This is under control of KC on input 206; when KC is at Vss, $\overline{KC}$ on line 199 disables the feedback circuitry through gate 351 and enables the K1 input to the program counter. Thus, in eight machine cycles, or 8 ×2 or 16 microseconds, a word address is presented. Each bit is loaded on $\phi 1$ time, as this is when the program counter can accept new data to node 168.

Second, a ROM page address may be parallel loaded into the ROM page address register 46 via K1 to K8 lines 75, devices 196, lines 192 and gates 46' of FIG. 10. This path is also enabled by $\overline{KC}$ being at -Vdd, and the bits are loaded on $\phi 2$. Since the word address comes in serially on $\phi 1$, and the page address in parallel on $\phi 2$, these may be time multiplexed, so no additional time is needed to load both. Recognizing that an entire new 8-bit word address is not needed to generate a new ROM address, but instead it may be advanced by 1 bit, it is seen that all 1024 locations could be addressed in much less than 1024×16 or 16000 microseconds.

Third, the 8-bit instruction word from the ROM, at the defined address, can be transferred into the program counter 36 from the lines 33 by external control. This is implemented by enabling the devices 162, to load $\overline{R0}$ to $\overline{R7}$ into nodes 164 of stages 36-0 to 36-7 as seen in FIG. 9. The devices 162 are controlled by $\overline{BRNCAL}$ on line 163, which can be generated by KC and K2 in gate 48-7 as seen in FIG. 11. This occurs in one machine cycle.

Fourth, the program counter 36 can be shifted out serially via line 165 of FIGS. 9 and 18, line 347, and segment output buffer 65-8, again under control of $\overline{KC}$ on line 199. This may occur one step ahead of, but at the same time, as a new ROM word address is being loaded in via K1 and line 350 of FIG. 19.

In order to test some or all of the ROM locations, the steps one, two, three and four just described would be implemented in order. All of the bits in all 1024 locations could be verified by a suitably designed test machine in less than about 20 milliseconds, which is much less than needed for some complex calculations in normal operation. Thus, vast savings in test time are possible.

Another test procedure is to load in a word and page address according to the first and secondsteps described above, then allow the machine to execute the sequence of instructions beginning at that location, then observe the results at the output terminals 17 and 18; and/or read out the last ROM output or address from the program counter after a certain number of cycles. This permits testing selected increments, which are sufficient to verify the integrity of the unit. In a typical complex operation, there are housekeeping routines which would be used again and again, perhaps hundreds of times, e.g. normallizing. These need not be checked but once. This procedure allows repetitive routines to be skipped.

It is understood, of course, that writing in and reading out ROM addresses and contents can be supplemented with reading in simulated keyboard entries.

Although the invention has been described with reference to a specific embodiment, this description is not meant to be construed in a limiting sense. Various modifications of the disclosed embodiment, as well as other embodiments of the invention, will become apparent to persons skilled in the air upon reference to the description of the invention. It is therefore contemplated that the appended claims will copy any such modifications or embodiments as fall within the true scope of the invention.

TABLE OF INSTRUCTIONS

CALL: 11XXXXXX

Conditional on status; if status line 79 is a logic O, then the CALL instruction is not performed. If status is 1, the machine goes into the CALL mode, as indicated by setting the CALL latch 200 to a logic 1. The program counter 36 is stored in the subroutine register 43. The page address is stored in the buffer 47. The contents of the buffer register 47 are used as the page address. The W field R2 to R7 of the instruction word is loaded into the program counter 36 via devices 162. All instructions executed while in the CALL mode operation their normal functions, except for the CALL and branch instructions; execution of a CALL within a CALL mode is not valid; branches executed within a call mode must be intrapage.

BRANCH (BRNC): 10XXXXXX

Conditional on status; if status is a logic O, then the branch instruction is not peformed. If status is 1, then the W field is loaded into the program counter 36 and the contents of the buffer register 47 become the new page address in the register 46, except when in the CALL mode. Branch (as well as CALL) can be unconditional because of the nature of status logic 66. Status is normally in logic 1 which is the proper condition for successfully performing a branch or CALL. If the instruction immediately preceeding the branch or CALL does not affect status, then the operation will be successful. Status is valid for only one instruction cycle. It is therefore invalid to perform multiple tests before a branch operation. Only that instruction immediately preceeding the branch instruction determines whether branching is successful. Status always returns to logic 1 after a branch instruction.

LOAD Y REGISTER WITH A CONSTANT (TRCY): 0100XXXX

The C field of the instruction word, bits R4 thru R7, is transferred into the Y register 40. This is unconditional, and neither carry nor compare go to status logic 66.

COMPARE Y REGISTER TO A CONSTANT (YNEC): 0101XXXX

The contents of the Y register 40 are compared to the C field of the instruction word. Compare information on line 67 is input to the status logic 66. Inequality will force status to a logical 1. This instruction is not conditional on status.

CONSTANT STORE, INCREMENT Y REGISTER (CMIY): 0110XXXX

The contents of the C field is stored directly into the memory location addressed by the X and Y registers 73 and 40. The Y register 40 is then incremented by one. The instruction is not conditional on status, and carry and compare do not go to status.

ACCUMULATOR LESS THAN OR EQUAL TO CONSTANT (ALEC): 0111XXXX

The accumulator 52 is subtracted from the C field of the instruction word, using 2's complement addition. Resulting carry information on line 67 is input to the status logic 66. If the accumulator is less than or equal to the constant, status will be set to a logic 1. The instruction is unconditional.

LOAD P REGISTER (LDP): 0001XXXX

The buffer register 47 is loaded with the contents of the C field in the instruction word. This is unconditional and neither carry nor compare go to status.

Bit Set (SBIT): 001100XX

The contents of the memory location addressed by the X and Y registers 73 and 40 is selected. One of the four bits, as selected by the B field of the instruction word, is set to a logic 1.

BIT RESET (RBIT): 001101XX

The contents of the RAM 25 memory location addressed by the X and y registers 73 and 40 is selected. One of the four bits, as selected by the B field of the instruction word via CKB logic 56, is reset to a logic 0.

BIT TEST (TBIT): 001110XX

The contents of the memory location addressed by the X and Y registers 73 and 40 is selected. One of the four bits, as selected by the B field of the instruction word via CKB 56, is tested in the adder 50. A logical 1 in the selected bit will set status to a logic 1, via compare output to status on line 67.

LOAD X REGISTER (LDX): 001111XX

The X or RAM page address register 73 is loaded from the B field of the instruction word. This is unconditional, and neither cary nor compare go to status logic 66.

STORE AND INCREMENT (STIN): 00100000

The contents of the accumulator 52 are stored in the RAM memory location addressed by the X and Y registers 73 and 40. After completion of the store operation, the Y register 40 is incremented by one. Unconditional; status is not affected.

TRANSFER MEMORY TO ACCUMULATOR (TRMA): 00100001

The contents of the RAM memory location addressed by the X and Y registers 73 and 40 is unconditionally transferred into the accumulator 52. Memory data in the RAM is unaltered. Unconditional, and carry and compare do not go to status.

TRANSFER MEMORY TO Y REGISTER (TRMY): 00100010

The contents of the RAM memory location addressed by the X and Y registers 73 and 40 is unconditionally transferred into the Y register 40. Memory data in the RAM is unaltered.

TRANSFER Y REGISTER TO ACCUMULATOR (TRYA): 00100011

The Y register 40 is unconditionally transferred into the accumulator 52. Contents of the Y register 40 are unaltered.

TRANSFER ACCUMULATOR TO Y REGISTER (TRAY) 00100100

The accumulator 52 is unconditionally transferred into the Y register 40. Accumulator contents are unaltered.

MEMORY AND ACCUMULATOR ADD (AMAA): 00100101

The contents of the accumulator 52 are added to the contents of the RAM memory location addressed by the X and Y registers 73 and 40 with the resulting sum stored into the accumulator 52. Resulting carry information on line 67 is input to the status logic 66. A sum that is greater than fifteen will set status to a logic 1. The contents of the memory location in the RAM 25 are unaltered.

COMPARE MEMORY TO ZERO (MNEO): 00100110

The RAM memory contents addressed by the X and Y registers 73 and 40 are compared to zero. Comparison information on line 67 is input to the status logic. Inequality between memory and zero will set status 66 to a logic 1.

MEMORY AND ACCUMULATOR SUBTRACT (SMAA): 00100111

The contents of the accumulator 52 are subtracted from the contents of the RAM memory location addressed by the X and Y registers 73 and 40 using 2's complement addition with the difference stored into the accumulator 52. Resulting carry information is input to status 66. Status will be set to logic 1 if the accumulator is less than or equal to the memory.

LOAD INCREMENTED MEMORY (INMA): 00101000

The contents of the RAM memory location addressed by the X and Y registers 73 and 40 is incremented by one and stored into the accumulator 52. The original contents of the RAM memory are unaltered. Resulting carry information is input via line 67 to the status logic 66. Status will be set to a logic 1 if the sum is greater than fifteen.

ACCUMULATOR LESS THAN OR EQUAL TO MEMORY (ALEM): 00101001

The accumulator 52 is subtracted from the contents of the RAM memory location addressed by the X and Y registers 73 and 40 using 2's complement addition. Resulting carry information is input via line 67 to the status logic 66. Status equal to a logic 1 indicates that the accumulator is less than or equal to the memory. Memory and accumulator contents are unaltered.

LOAD DECREMENTED MEMORY (DCMA): 00101010

The contents of the RAM memory location addressed by the X and Y registers 73 and 40 are decremented by one and loaded into the accumulator 52. Memory contents are unaltered. Resulting carry information is input to the status logic. If memory is greater than or equal to one, status will be set to log 1.

INCREMENT Y REGISTER (INY)

The contents of the Y register 40 are incremented by one. Resulting carry information is input to the status logic 66. A sum greater than fifteen will set status to a logic 1.

DECREMENT Y REGISTER (DCY): 00101100

The contents of the Y register 40 are decremented by one. Resulting carry information is input to the status logic 66. If Y is greater than or equal to 1, status will be set to a logic 1.

2's Complement of the Accumulator (CIA): 00101101

The contents of the accumulator 52 are substracted from zero using 2's complement addition. The result is stored in the accumulator 52. Resulting carry information is input to the status logic 66. This operation is equivalent to complementing and incrementing the accumulator. If the accumulator contents are equal to zero, then status will be set to a logic 1.

EXCHANGE MEMORY AND ACCUMULATOR (EXMA): 00101110

The contents of the RAM memory location addressed by the X and Y registers 73 and 40 are exchanged with the accumulator 52. That is, the accumulator is stored into memory and memory is transferred into the accumulator.

CLEAR ACCUMULATOR (CLA): 00101111

The contents of the accumulator 52 are unconditionally set to zero.

ADD EIGHT TO THE ACCUMULATOR (A8AA): 00000001

The constant eight (8), as determined by bits R7 thru R4 of the instruction word, is added to the accumulator 52. Resulting carry information is input to the status logic 66. A sum greater than fifteen will set status to a logic 1.

COMPARE Y REGISTER TO THE ACCUMULATOR (YNEA): 00000010

The contents of the Y register 40 are compared to the contents of the accumulators 52. Comparison information is input to the status logic 66. Inequality between the Y register and the accumulator will set status to a logic 1. The logic state of status 66-1 is also copied into the status latch 66-2.

STORE ACCUMULATOR (STA): 00000011

The contents of the accumulator 52 are stored into the RAM memory location addressed by the X and Y registers 73 and 40. Accumulator 52 contents are unaffected.

STORE AND CLEAR ACCUMULATOR (STCLA): 00000100

The contents of the accumulator 52 are stored into the RAM memory location addressed by the X and Y registers 73 and 40. The accumulator 52 is then reset to zero.

ADD TEN TO THE ACCUMULATOR (A10AA): 00000101

The content ten (10), as determined by bits R7 and R4 of the instruction word, is added to the accumulator 52.

ADD SIX TO THE ACCUMULATOR (A6AA): 00000110

The constant six (6), as determined by bits R7 and R4 of the instruction word, is added to the contents of the accumulator 52. Resulting carry information is input to the status logic 66. A result greater than fifteen will set status to a logic 1.

DECREMENT ACCUMULATOR (DCA): 00000111

The contents of the accumulator 52 are decremented by one. Resulting carry information is input to the status logic 66. If accumulator is greater than or equal to one, status will be set to a logic 1.

INCREMENT ACCUMULATOR (INA): 00001110

The contents of the accumulator 52 are incremented by one.

COMPLEMENT X REGISTER (COMX): 00000000

The contents of the X or RAM page address register 73 are logically complemented.

LOAD EXTERNAL INPUTS (TRKA): 00001000

Data present on the four external K input lines 75 is transferred into the accumulator 52.

TEST EXTERNAL INPUTS (KNEO): 00001001

Data on the external K input lines 75 is compared to zero. Comparison information is input to the status logic 66. Non-zero external data will set status to a logic 1.

LOAD OUTPUT REGISTER (LDO): 00001010

The contents of the accumulator 52 and the status latch 66-2 are transferred to the output register 62. The register 62 can be decoded in 62 to supply data to as many as eight output lines 17 and is a primary register used in data output external to the chip. The contents of the Y register 40 are also decremented by one.

CLEAR O OUTPUT REGISTER (CLRO): 00001011

The contents of the output register 62 are set to a zero.

RESET D [Y] OUTPUT (RSTR): 00001100

If the contents of the Y register 40 are between 0 through 12 inclusive, then one of the D outputs will be reset to a logic 0. Selection of the D output is determined by the decoded contents of the Y register 40. For values greater than 12 in the Y register, the instruction is a no-op to the user.

SET D [Y] OUTPUT (SETR): 00001101

If the contents of the Y register 40 are between 0 thru 12 inclusive, then one of the D outputs will be set to a logic 1. Selection of the D output is determined by the decoded contents of the Y register 40. For values greater than 12 in the Y register, the instruction is a no-op to the user.

RETURN (RETN): 00001111

When executed in the CALL mode, the contents of the subroutine register 43 are transferred into the program counter 36. Simultaneously, the contents of the buffer register 47 are transferred into the ROM page address register 46. This operation will return the system to the proper point after a subroutine has been executed.

When a return instruction is executed in the non-CALL mode, that is, when not executing a subroutine, it is a no-operation.

| INSTRUCTION CODE | | | MNEMONIC |
|---|---|---|---|
| 1 | 1 | W | CALL |
| 1 | 0 | W | BRNC |
| 0 | 100 | C | TRCY |
| 0 | 101 | C | YNEC |
| 0 | 110 | C | CMIY |
| 0 | 111 | C | ALEC |
| 0 | 011 | 00 B | SBIT |
| 0 | 011 | 01 B | RBIT |
| 0 | 011 | 10 B | TBIT |
| 0 | 011 | 11 B | LDX |
| 0 | 010 | 0000 | STIN |
| 0 | 010 | 0001 | TRMA |
| 0 | 010 | 0010 | TRMY |
| 0 | 010 | 0011 | TRYA |
| 0 | 010 | 0100 | TRAY |
| 0 | 010 | 0101 | AMAA |
| 0 | 010 | 0110 | MNEO |
| 0 | 010 | 0111 | SMAA |
| 0 | 010 | 1000 | INMA |
| 0 | 010 | 1001 | ALEM |
| 0 | 010 | 1010 | DCMA |
| 0 | 010 | 1011 | INY |
| 0 | 010 | 1100 | DCY |
| 0 | 010 | 1101 | CIA |
| 0 | 010 | 1110 | EXMA |
| 0 | 010 | 1111 | CLA |
| 0 | 001 | C | LDP |
| 0 | 000 | 0000 | COMX |
| 0 | 000 | 0001 | A8AA |
| 0 | 000 | 0010 | YNEA |
| 0 | 000 | 0011 | STA |
| 0 | 000 | 0100 | STCLA |
| 0 | 000 | 0101 | A10AA |
| 0 | 000 | 0110 | A6AA |
| 0 | 000 | 0111 | DCA |
| 0 | 000 | 1000 | TRKA |
| 0 | 000 | 1001 | KNEC |
| 0 | 000 | 1010 | LDO |
| 0 | 000 | 1011 | CLRO |
| 0 | 000 | 1100 | RSTR |
| 0 | 000 | 1101 | SETR |
| 0 | 000 | 1110 | INA |
| 0 | 000 | 1111 | RETN |

What is claimed is:

1. An electronic digital processor system implemented in MOS/LSI semiconductor means, comprising; data storage means including a random access memory; program storage means including a read-only-memory containing a large number of instruction words; addressing means operatively coupled to the random access memory and to the read-only-memory for accessing data and instruction words; arithmetic means for performing arithmetic operations on input digits applied thereto; control means receiving the instruction words from the read-only-memory and generating command signals for defining the operation of the system; a plurality of precharge type MOS devices included in the system as part of the addressing means and the control means; timing means in the system defining a recurring machine cycle of fixed length during which the random access memory is accessed, the read-only-memory is accessed, the control means receives an instruction word and generates commands, and the arithmetic means receives an input; characterized in that the timing means includes means for generating multiple clock voltages within each machine cycle, including a first clock voltage of a first interval during which the random access memory is accessed, a second clock voltage of a second interval during which the read-only-memory is accessed, the first and second intervals not overlapping, a third clock voltage of a third interval during which a plurality of said precharge type MOS devices in the system are precharged, the third interval overlapping part of the first and second intervals, and a fourth clock voltage having two distinct pulses in each machine cycle with one pulse occurring during part of the first interval and the other pulse occurring during part of the second interval, the fourth clock voltage being used in said addressing means for the random access memory and the read-only-memory.

2. A system according to claim 1 wherein: the random access memory includes the timing means generates a fifth clock voltage of a fifth interval during each machine cycle, the fifth interval occurring between the first and second intervals and overlapping neither; and the fifth clock voltage is applied to said data refresh circuitry in the random access memory.

3. A system according to claim 1 wherein the pulses of the fourth clock voltage occur during the initial part of the first and second intervals, respectively.

4. A system according to claim 1 wherein the first and second intervals are not adjacent but are spaced in time from one another.

5. A system according to claim 1 wherein the third interval begins after the beginning of the first interval and ends prior to the end of the second interval.

6. A system according to claim 1 wherein the machine cycle includes six time segments, the first interval occurring during two segments, the second interval occurring during two segments, the third interval occurring during three segments, and the pulses of the fourth clock voltage occurring during one segment each.

7. A system according to claim 6 wherein the pulses of the fourth clock voltage occur during the first of two segments in each of the first and second intervals.

8. An electronic digital processor system implemented in MOS/LSI semiconductor means, comprising: data storage means including a random access memory; program storage means including a read-only-memory containing a large number of instruction words; addressing means operatively coupled to the random access memory and to the read-only-memory for accessing data and instruction words; arithmetic means for performing arithmetic operations on input digits applied thereto; control means receiving the instruction words from the read-only-memory and generating command signals for defining the operation of the system; timing means in the system defining a recurring machine cycle of fixed length during which the random access memory is accessed, the read-only-memory is accessed, the control means receives an instruction word and generates commands, and the arithmetic means receives an input; characterized in that the timing means includes means for generating muliple clock voltages within each machine cycle, including a first clock voltage of a first interval during which the random access memory is accessed, a second clock voltage of a second interval during which the read-only-memory is accessed, the first and second intervals not overlapping, and a third clock voltage having two distinct pulses in each machine cycle with one pulse occurring during part of the first interval and the other pulse occurring during part of the second interval, the third clock voltage being used in said addressing means for the random access memory and the read-only-memory.

9. A system according to claim 8 wherein: the random access memory includes data refresh circuitry; the timing means generates a fourth clock voltage of a fourth interval occurring between the first and second intervals and overlapping neither; and the fourth clock voltage is applied to said data refresh circuitry in the random access memory.

10. A system according to claim 8 wherein the pulses of the third clock voltage occur during the initial part of the first and second intervals, respectively.

11. A system according to claim 8 wherein the machine cycle includes six time segments, the first interval occurring during two segments, the second interval occurring during two segments, and the pulses of the third clock voltage occurring during one segment each.

12. A system according to claim 11 wherein the pulses of the third clock voltage occur during the first of two segments in each of the first and second intervals.

13. In an electronic digital system implemented in MOS/LSI semiconductor means: data storage means including a plurality of memory cells; addressing means for accessing the data storage means; program instruction access means; arithmetic means for performing arithmetic operations on input digits applied thereto; control means receiving instruction words from the instruction access means and generating command signals for defining the operation of the system; timing means in the system defining a recurring machine cycle of fixed length during which the data storage means is accessed, the instruction access means delivers an instruction word to the control means, the control means generates commands for such instruction word, and the arithmetic means receives an input; characterized in that the timing means includes means for generating multiple clock voltages within each machine cycle, including a first clock voltage of a first interval during which the data storage means is accessed, a second clock voltage of a second interval during which the instruction access means delivers an instruction word to the control means, the first and second intervals not overlapping, and a third clock voltage having two distinct pulses in each machine cycle with one pulse occurring during part of the first interval and the other pulse occurring during part of the second interval, the third clock voltage being used in said addressing means for the data storage means and in the instruction access means.

14. In a system according to claim 13: the means for generating produces clock voltage of a fourth interval during each machine cycle, the fourth interval occurring between the first and second intervals and overlapping neither; the data storage means including data refresh circuitry, the fourth clock voltage being applied to the data refresh circuitry in the data storage means.

15. In a system according to claim 13: the pulses of the third clock voltage occurring during the initial part of the first and second intervals, respectively.

16. In a system according to claim 13: the machine cycle including six time segments, the first interval occurring during two segments, the second interval occurring during two segments, and the pulses of the third clock voltage occurring during one segment each.

17. In a system according to claim 16: the pulses of the third clock voltage occurring during the first of two segments in each of the first and second intervals.

18. An electronic digital system implemented in large scale integrated semiconductor means, comprising: data storage means including a plurality of memory cells; addressing means for accessing the data storage means; program instruction storage means; addressing means for accessing the instruction storage means; arithmetic means for performing arithmetic operations on a plurality of parallel data bits applied thereto; control means receiving instruction words from the instruction storage means and generating command signals for defining the operation of the system; timing means in the system defining a recurring machine cycle of a given length during which the data storage means is accessed, the instruction storage means delivers an instruction word to the control means, the control means generates commands from such instruction word, and the arithmetic means receives an input, the improvement wherein the timing means includes means for generating multiple clock voltages within each machine cycle, including a first clock voltage having a first interval during which the data storage means is accessed, a second clock voltage having a second interval during which the instruction storage means delivers an instruction word to the control means, the first and second intervals not overlapping, and a third clock voltage having two distinct pulse intervals in each machine cycle with one pulse interval occurring during part of said first interval and the other pulse interval occurring during part of said second interval, the third clock voltage being used in said addressing means for the instruction storage means.

19. A system according to claim 18 wherein the means for generating produces a fourth clock voltage having a fourth interval during each machine cycle, the fourth interval occurring between said first and second intervals and overlapping neither; the data storage means including data refresh circuitry, the fourth clock voltage being applied to the data refresh circuitry in the data storage means.

20. A system according to claim 18 wherein the pulse intervals of the third clock voltage occurring during the initial part of the first and second intervals, respectively.

21. An electronic digital system implemented in large scale integrated semiconductor means, comprising: data storage means including a plurality of memory cells; addressing means for accessing the data storage means; program instruction access means including program addressing decoder means; arithmetic means for performing arithmetic operations on a plurality of parallel data bits applied thereto; control means receiving instruction words from the instruction access means and generating command signals for defining the operation of the system; timing means in the system defining a recurring machine cycle of fixed length during which the data storage means is accessed, the instruction access means delivers an instruction word to the control means, the control means generates commands from such instruction word, and the arithmetic means receives an input; the improvement wherein the timing means includes means for generating multiple clock voltages within each machine cycle, including a first clock voltage having a first interval during which the data storage means is accessed, a second clock voltage having a second interval during which the instruction access means delivers an instruction word to the control means, the first and second intervals not overlapping, and a third clock voltage having two distinct pulses in each machine cycle with one pulse occurring during part of the first interval and the other pulse occurring during part of the second interval, the third clock voltage being used in said program addressing decoder means.

22. A system according to claim 21 wherein the means for generating clock voltages produces a fourth clock voltage of a fourth interval during each machine cycle, the fourth interval occurring between the first and second intervals and overlapping neither; the data storage means including data refresh circuitry, the fourth clock voltage being applied to the data refresh circuitry in the data storage means.

* * * * *